(12) United States Patent
Kato

(10) Patent No.: US 7,997,499 B2
(45) Date of Patent: Aug. 16, 2011

(54) SEMICONDUCTOR DEVICE

(75) Inventor: Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 944 days.

(21) Appl. No.: 11/919,011

(22) PCT Filed: May 25, 2006

(86) PCT No.: PCT/JP2006/310946
§ 371 (c)(1),
(2), (4) Date: Oct. 22, 2007

(87) PCT Pub. No.: WO2006/129742
PCT Pub. Date: Dec. 7, 2006

(65) Prior Publication Data
US 2009/0057416 A1    Mar. 5, 2009

(30) Foreign Application Priority Data
May 30, 2005    (JP) .................................. 2005-157843

(51) Int. Cl.
*G06K 19/06*    (2006.01)
(52) U.S. Cl. ........................................................ 235/492
(58) Field of Classification Search .................... 235/492
See application file for complete search history.

(56) References Cited

U.S. PATENT DOCUMENTS

| | | | |
|---|---|---|---|
| 5,283,462 A | 2/1994 | Stengel | |
| 6,118,148 A * | 9/2000 | Yamazaki | 257/327 |
| 6,493,275 B2 * | 12/2002 | Tomita | 365/189.09 |
| 7,009,884 B2 * | 3/2006 | Yaoi et al. | 365/185.22 |
| 2004/0056725 A1 | 3/2004 | Kitamura et al. | |
| 2004/0145034 A1 | 7/2004 | Fujioka et al. | |
| 2004/0212741 A1 | 10/2004 | Hijikata et al. | |
| 2005/0133790 A1 | 6/2005 | Kato | |
| 2005/0146006 A1 | 7/2005 | Yamazaki et al. | |

(Continued)

FOREIGN PATENT DOCUMENTS

EP    0 720 185    7/1996

(Continued)

OTHER PUBLICATIONS

International Search Report (Application No. PCT/JP2006/310946) dated Jul. 11, 2006.

(Continued)

*Primary Examiner* — Jamara A Franklin
(74) *Attorney, Agent, or Firm* — Eric J. Robinson; Robinson Intellectual Property Law Office, P.C.

(57) ABSTRACT

An object of the present invention is to achieve a wireless chip with high reliability, a small chip area, and low power consumption, where voltage that is generated inside is prevented from excessively increasing also in a strong magnetic field such as in the case of approaching an antenna. A resonant circuit including a MOS capacitor element that has a predetermined threshold voltage is used to achieve a wireless chip. This allows a parameter of the resonant circuit to be prevented from changing in the case where the voltage amplitude exceeds a predetermined value in a strong magnetic field so that the wireless chip can be kept far away from the resonant condition. Accordingly, generation of excessive voltage is allowed to be prevented without the use of a limiter circuit or a constant voltage generation circuit.

7 Claims, 29 Drawing Sheets

U.S. PATENT DOCUMENTS

| | | |
|---|---|---|
| 2005/0210302 A1 | 9/2005 | Kato et al. |
| 2006/0192019 A1 | 8/2006 | Kato et al. |

FOREIGN PATENT DOCUMENTS

| | | |
|---|---|---|
| JP | 11-133860 | 5/1999 |
| JP | 2004-228989 | 8/2004 |
| JP | 2004-282506 | 10/2004 |
| JP | 2005-322899 | 11/2005 |
| WO | WO 93/08578 | 4/1993 |
| WO | WO 2005/098955 | 10/2005 |

OTHER PUBLICATIONS

Written Opinion (Application No. PCT/JP2006/310946) dated Jul. 11, 2006.

* cited by examiner

FIG. 6A
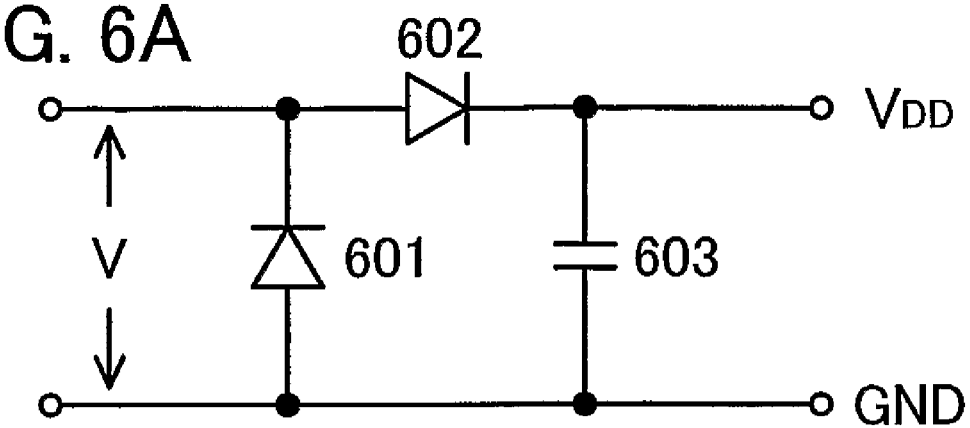
FIG. 6B
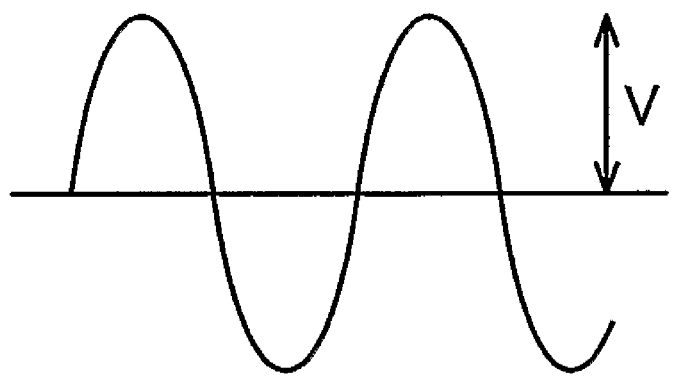
FIG. 6C
V_DD ─────────────────
GND ─────────────────

FIG. 7A
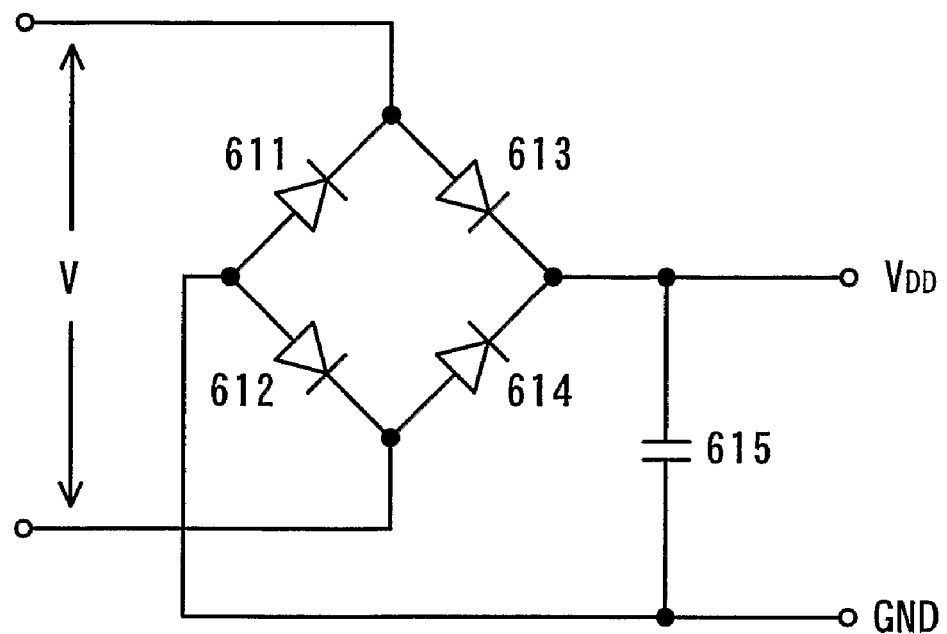
FIG. 7B
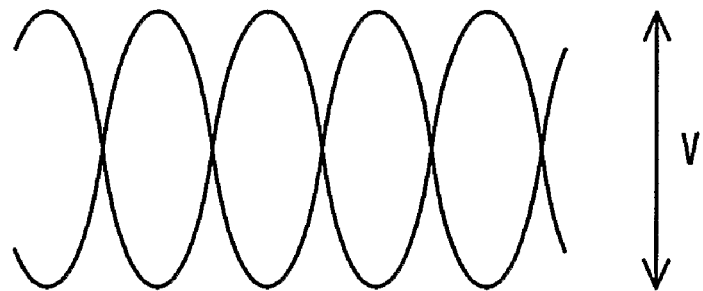
FIG. 7C
V_DD
GND

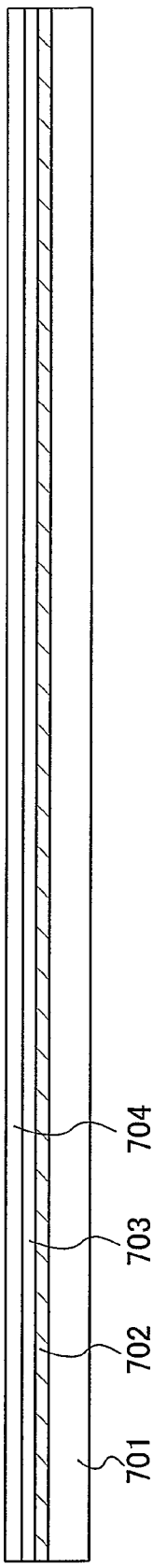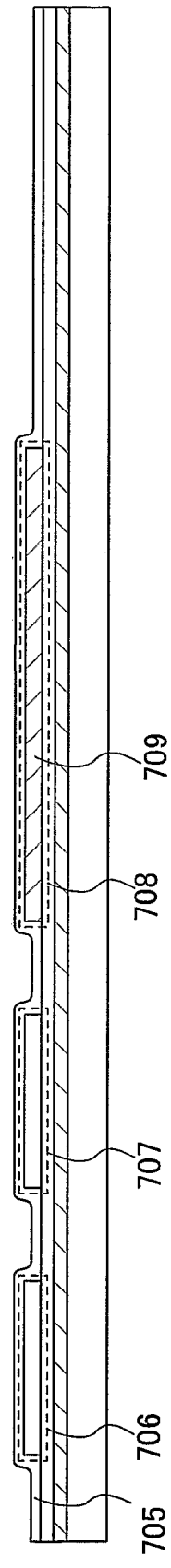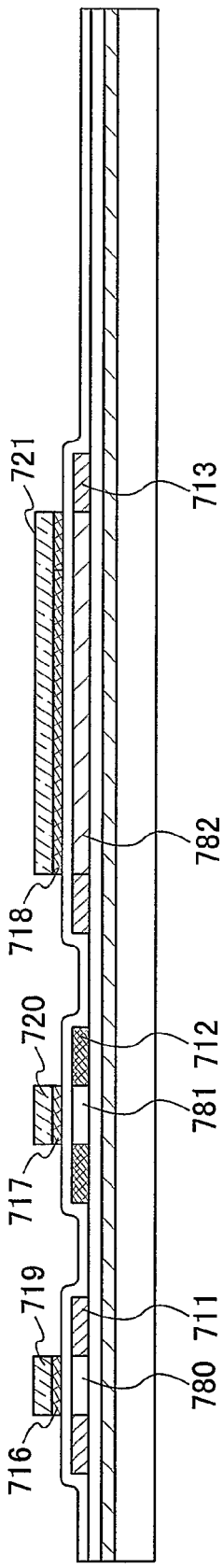

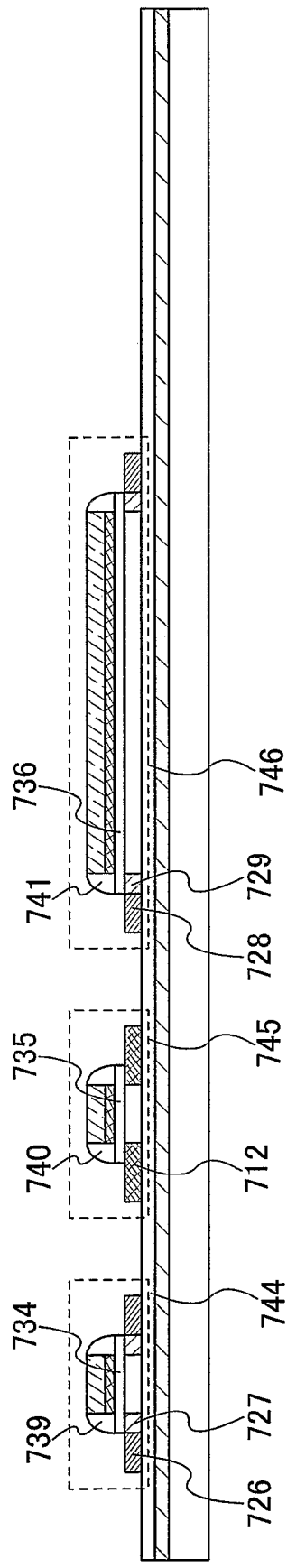
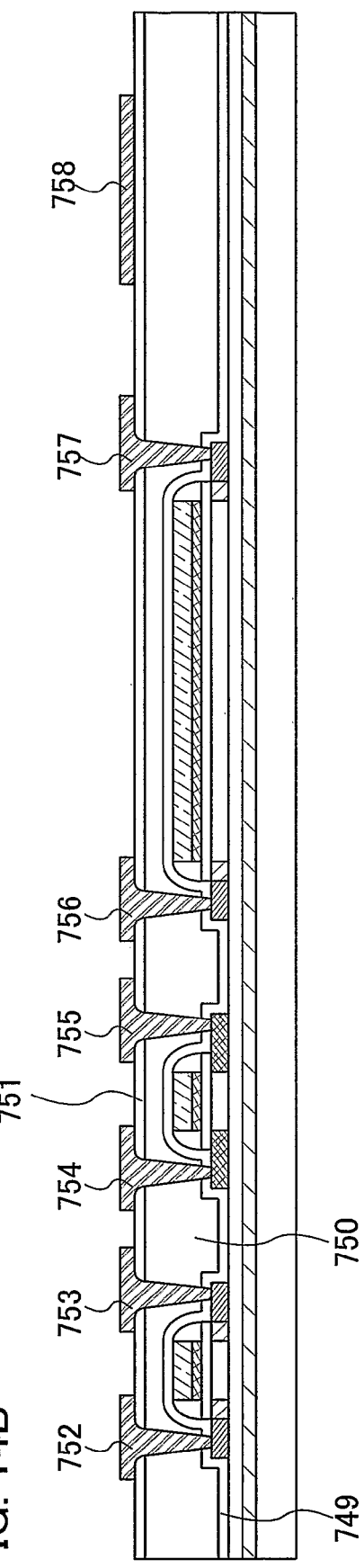
FIG. 14A
FIG. 14B

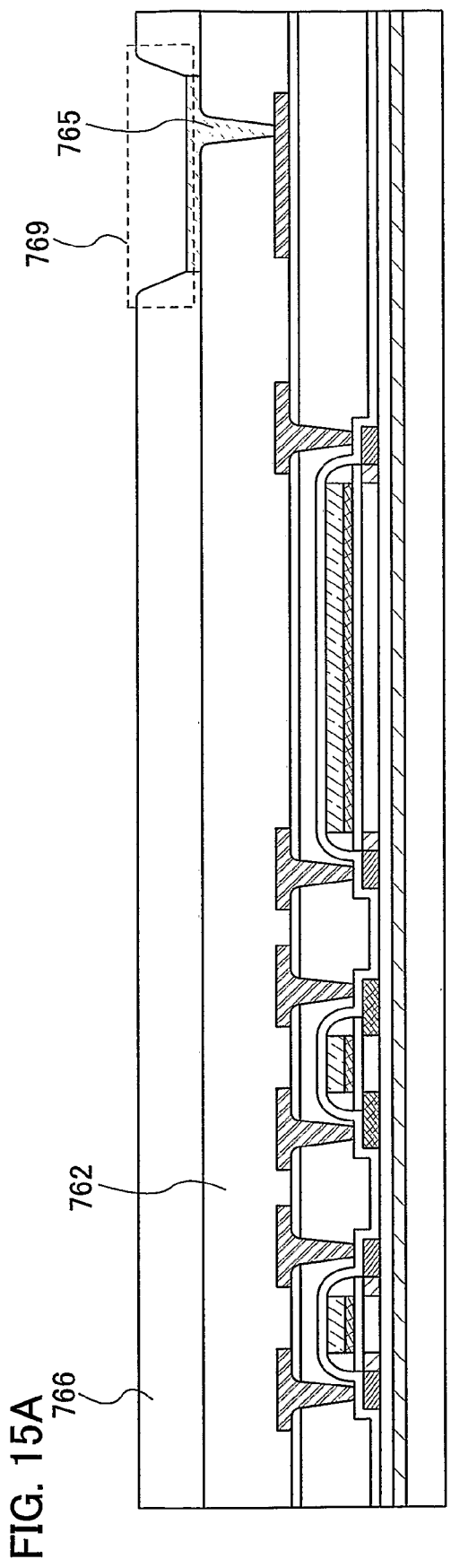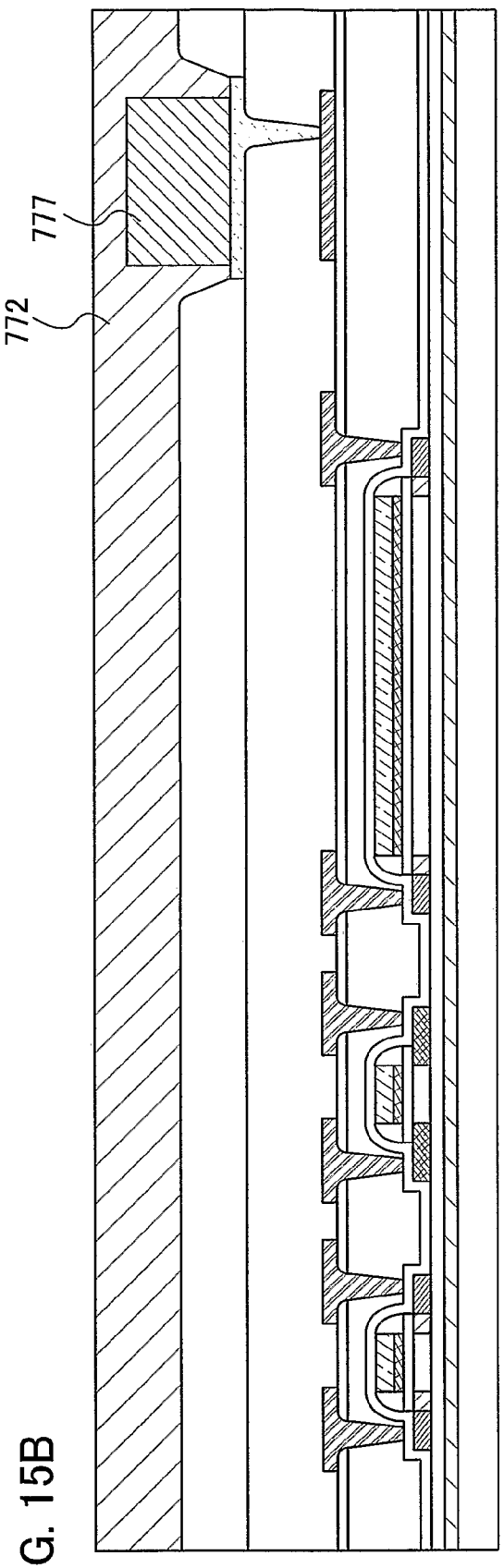
FIG. 15A
FIG. 15B

SEMICONDUCTOR DEVICE

TECHNICAL FIELD

The present invention relates to a semiconductor device that is capable of wirelessly transmitting or receiving data.

BACKGROUND ART

In recent years, the development of a semiconductor device that is capable of transmitting or receiving data wirelessly has been advanced. Such a semiconductor device is referred to as an RFID (Radio Frequency Identification) tag, an RF chip, an RF tag, an IC chip, an IC tag, a wireless chip, a wireless tag, an electronic chip, an electronic tag, a wireless processor, a wireless memory, or the like. An integrated circuit to be incorporated, which is formed on a single-crystal silicon substrate, is the mainstream of semiconductor devices that are currently in practical use (for example, refer to Patent Document 1).

[Patent Document 1]

Japanese Patent Laid-Open No. 11-133860

A semiconductor device (hereinafter referred to as a wireless chip) that is capable of transmitting or receiving data wirelessly has a problem that voltage that is generated inside excessively increases in a strong magnetic field such as in the case of approaching an antenna to break an element such as a transistor constituting a circuit.

In response, there is a method of preventing excessively high voltage from being generated by adding circuits such as a limiter circuit and a constant voltage generation circuit (refer to Patent Document: Japanese Patent Application No. 2005-111799). However, this method increases the circuit area by adding the extra circuits.

In addition, the absorbed power is the same as that in the case of generating excessive voltage to lead to the problem of high power consumption.

DISCLOSURE OF INVENTION

The present invention has been made in view of the foregoing. It is an object of the present invention to achieve a wireless chip with high reliability, a small chip area, and low power consumption by preventing voltage that is generated inside from excessively increasing also in a strong magnetic field such as in the case of approaching an antenna and adding no extra circuits such as a limiter circuit and a constant voltage generation circuit.

As a means for achieving the object, the inventor has considered preventing generation of excessive voltage by changing a parameter of a resonant circuit to be kept away from the resonance condition in the case where voltage that is generated in the resonant circuit exceeds a predetermined voltage. In addition, in order to constitute a resonant circuit with such a structure, nonlinearity of a MOS capacitor element is focused on.

The present invention provides a new wireless chip that is capable of preventing excessive voltage from being generated by using a resonant circuit including a MOS capacitor element that has a predetermined threshold voltage without the use of a limiter circuit or a constant voltage generation circuit.

A MOS capacitor element to be used in the present invention will be described with reference to FIGS. 2A to 2C. A capacitor element is made up of stacked layers of a conductive film, an insulating film, and a conductive film, and has two terminals (hereinafter also referred to as a normal capacitor element in distinction from a MOS capacitor element). Such a normal capacitor element does not depend on voltage, and has a constant capacitance value as shown in FIG. 2C. In the case of providing a resonant capacitor in a chip as in the present invention, it is preferable to use a capacitor element that has a stacked structure of a conductive film, an insulating film, and a conductive film since it is necessary to function as a capacitor element when either positive or negative signal is input to the both ends of the capacitor element.

Meanwhile, a MOS capacitor element is a capacitor element composed of stacked layers of a conductive film, an insulating film, and a semiconductor region, and has two terminals of an electrode on the conductive film side (Voltage: $V_m$) and an electrode on the semiconductor region side (Voltage: $V_s$). Hereinafter, the electrode on the conductive film side and the semiconductor region overlapped with the electrode on the conductive film side with the insulating film interposed therebetween may be respectively referred to as a gate electrode and a channel forming region by making analogies to names in a transistor.

An N-type MOS capacitor element has a threshold voltage $V_{thn}$, where an N-type inversion layer is formed in a channel forming region when $V_m > V_s + V_{thn}$ is satisfied. Accordingly, the channel forming region has conductivity in $V_m > V_s + V_{thn}$ and functions as a normal capacitor element. A P-type MOS capacitor element has a threshold voltage $V_{thp}$, where a P-type inversion layer is formed in a channel forming region when $V_m < V_s + V_{thp}$ is satisfied. Accordingly, the channel forming region has conductivity in $V_m < V_s + V_{thp}$ and functions as a normal capacitor element. In conditions except for above, the capacitance values are almost 0.

These behaviors are shown in FIGS. 2A and 2B. FIG. 2A shows the relation 201 between a capacitance value C and a voltage V of an N-type MOS capacitor element that has a threshold voltage $V_{thn1}$ and the relation 202 between a capacitance value C and a voltage V of an N-type MOS capacitor element that has a threshold voltage $V_{thn2}$. FIG. 2B shows the relation 203 between a capacitance value C and a voltage V of a P-type MOS capacitor element that has a threshold voltage $V_{thp1}$ and the relation 204 between a capacitance value C and a voltage V of a P-type MOS capacitor element that has a threshold voltage $V_{thp2}$. It is to be noted that the figures show cases in $V_{thn2} < V_{thn1}$ and $V_{thp1} < V_{thp2}$.

A feature of the wireless chip according to the present invention is to include a resonant circuit including a MOS capacitor element that has a predetermined threshold voltage as shown in FIG. 2A or 2B.

Methods for controlling the threshold voltage of a MOS capacitor element to have a predetermined value include a method of controlling the concentration of an impurity element included in a channel forming region of the MOS capacitor element by ion doping or ion implantation. In addition, the threshold voltage can be controlled to some extent by appropriately selecting materials for the conductive film, the insulating film, and the semiconductor region.

It is to be noted that a feature of the resonant circuit included in the wireless chip according to the present invention is to include an N-type MOS capacitor element that has a negative threshold voltage or a P-type MOS capacitor element that has a positive threshold voltage.

In the present invention, the MOS capacitor element has a constant capacitance value under the condition that high voltage is not generated. Meanwhile, it is necessary in order to have a constant capacitance value that the N-type MOS capacitor element have a negative threshold voltage ($V_{thn} < 0$) and the P-type MOS capacitor element have a positive threshold voltage ($V_{thp} > 0$) since alternating voltage is applied to the MOS capacitor element that is used in the present invention and both positive and negative voltages are applied between the two terminals of the capacitor element.

The present invention is superior also in power consumption. In the case of using a limiter circuit and a constant voltage generation circuit, the absorbed power remains unchanged even when these circuits function to prevent generation of excessive voltage. Since the resonant circuit according to the present invention prevents generation of excessive voltage by shifting the resonance point, power absorption itself can be suppressed. Accordingly, the power consumption can be reduced.

This is effective particularly in the case of reading a plurality of chips and the like. When a plurality of chips is put in a magnetic field, power absorption of each chip influences the magnetic field to result in deviation of the resonance points of the chips. Accordingly, there is a problem that the performance of reading the plurality of chips is diminished. The present invention is able to suppress power absorption particularly under the condition of high power absorption, and provides excellent characteristics even in the case of reading a plurality of chips.

In addition, in the present invention, the circuit area can be made smaller since a circuit such as a limiter circuit or a constant voltage generation circuit is not added. Further, when a gate insulating film is used as the insulating film of the MOS capacitor element, the area of the capacitor element can be made smaller as compared with that of a capacitor element using another insulating film since the gate insulating film is thin and has favorable film quality.

The wireless chip according to the present invention may be formed over a single-crystalline silicon substrate, or formed over a glass substrate or a flexible base such as a plastic substrate.

In particular, the mode of forming the chip over the flexible substrate is advantageous in various applications such as embedment in paper and attachment to a curved surface in terms of added value in flexibility of the wireless chip itself. It is often the case that the capability of reading a plurality of chips is important in these applications, and the aspect of the present invention is thus preferable.

In particular, the mode of forming the wireless chip over a glass substrate or the mode of transferring the chip formed over a glass substrate to a flexible base is superior in cost as compared with a mode of forming the chip on a single-crystalline silicon substrate. This is because a glass substrate is much larger than a single-crystalline silicon substrate. On the other hand, the mode of forming the chip on the glass substrate has the problem of a large chip area. However, the aspect of the present invention can be said to be preferable since the area of the MOS capacitor element is small and it is not necessary to provide a limiter or a constant voltage generation circuit.

Here are specific aspects of the preset invention.

One aspect of a semiconductor device according to the present invention is to have a resonant circuit including an N-type MOS capacitor element that has a negative threshold voltage, where data is transmitted and received wirelessly through an antenna.

In particular, it is preferable that the threshold voltage of the N-type MOS capacitor element be in the range of −0.1 V to −24 V.

In addition, it is preferable that the threshold voltage of the N-type MOS capacitor element have an absolute value that is in the range of half of the minimum operation power supply voltage to twice the maximum operation power supply voltage.

In addition, it is preferable that a semiconductor region of the N-type MOS capacitor element include an N-type impurity element at a concentration of $1\times10^{17}$ atoms/cm$^3$ to $1\times10^{20}$ atoms/cm$^3$.

Another aspect of the semiconductor device according to the present invention is to have a resonant circuit including a P-type MOS capacitor element that has a positive threshold voltage, where data is transmitted and received wirelessly through an antenna.

In particular, it is preferable that the threshold voltage of the P-type MOS capacitor element be in the range of 0.1 V to 24 V.

In addition, it is preferable that the threshold voltage of the P-type MOS capacitor element have an absolute value that is in the range of half of the minimum operation power supply voltage to twice the maximum operation power supply voltage.

In addition, it is preferable that a semiconductor region of the P-type MOS capacitor element include a P-type impurity element at a concentration of $1\times10^{17}$ atoms/cm$^3$ to $1\times10^{20}$ atoms/cm$^3$.

The semiconductor device according to the present invention may have an integrated circuit provided over a glass substrate or a flexible substrate.

The semiconductor device according to the present invention may have an integrated circuit including a thin film transistor.

Another aspect of the present invention is a bill, a coin, securities, a certificate, a bearer bond, a container for wrapping, a book, a storage medium, a vehicle, food, a garment, a health product, a daily commodity, medicine, or an electronic device equipped with the semiconductor device described above.

The present invention can achieve a wireless chip with high reliability which prevents voltage that is generated inside from excessively increasing also in a strong magnetic field such as in the case of approaching an antenna.

In addition, a wireless chip with a small chip area can be achieved since extra circuits, such as a limiter circuit and a constant voltage generation circuit, are not added.

Further, since the resonant circuit according to the present invention prevents generation of excessive voltage by shifting the resonance point, power absorption itself can be suppressed unlike in the case of using a limiter circuit and a constant voltage generation circuit. Accordingly, the power consumption can be reduced. The present invention has a great effect particularly in an application where a plurality of chips needs to be read.

In addition, a mode of forming the wireless chip over a flexible base can be considered for various applications, and the aspect of the present invention for suppressing power absorption is effective in the case of reading a plurality of chips. Therefore, synergetic effects can be obtained in various applications.

BRIEF DESCRIPTION OF DRAWINGS

FIGS. 6A to 6C are a power supply circuit of a semiconductor device according to the present invention.

FIGS. 7A to 7C are a power supply circuit of a semiconductor device according to the present invention.

FIGS. 13A to 13C are diagrams illustrating a method for manufacturing a semiconductor device according to the present invention.

FIGS. 14A and 14B are diagrams illustrating the method for manufacturing the semiconductor device according to the present invention.

FIGS. 15A and 15B are diagrams illustrating the method for manufacturing the semiconductor device according to the present invention.

BEST MODE FOR CARRYING OUT THE INVENTION

Embodiment modes and embodiments of the present invention will be described in detail with reference to the drawings. However, the present invention can be practiced in various different modes, and it is to be easily understood by those skilled in the art that various changes in form and details may be made without departing from the spirit and scope of the invention. Accordingly, the present invention is not to be considered interpreted with limitation to the descriptions of the embodiment modes and the embodiments. It is to be noted that among all of the drawings for describing the embodiment modes and the embodiments, the same numerals are used for the same portions or portions that have like functions, and repeated descriptions thereof will be omitted.

Embodiment Mode 1

In the present embodiment mode, a resonant circuit that is used in the present invention will be described. This can be considered to be a most simplified mode of a wireless chip according to the present invention.

Figure 3A:
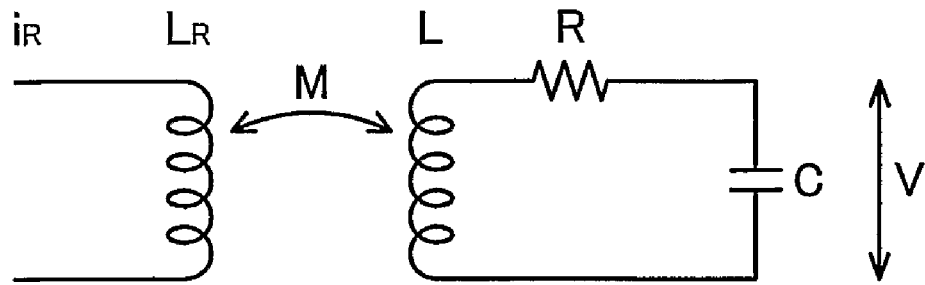
FIGS. 3A to 3C are a simplified diagram of a conventional semiconductor device and graphs for explaining operation thereof.

First, a conventional resonant circuit will be described with reference to FIGS. 3A to 3C. FIG. 3A shows a resonant circuit including a coiled antenna with an inductance L, a resistance element with a resistance value R, and a capacitor element with a capacitance value C that are connected in series, and shows an antenna (Inductance: $L_R$; Current: $i_R$) that powers this resonant circuit. This can be considered to be a simplified model representing a conventional wireless chip and a device (hereinafter referred to as a reader) that transmits and receives data with the wireless chip. When M and ω are assumed to respectively denote the mutual inductance between the two antennas and an angular frequency in FIG. 3A, the amplitude V of an alternating voltage induced between the opposite ends of the capacitor element is given by a formula 1. In particular, a case that satisfies $\omega^2 LC=1$ is referred to as a resonant condition, where voltage amplitude V is the maximum.

$$V = \frac{\omega M i_R}{\sqrt{(\omega RC)^2 + (1 - \omega^2 LC)^2}} \quad \text{[Formula 1]}$$

Figure 3B:
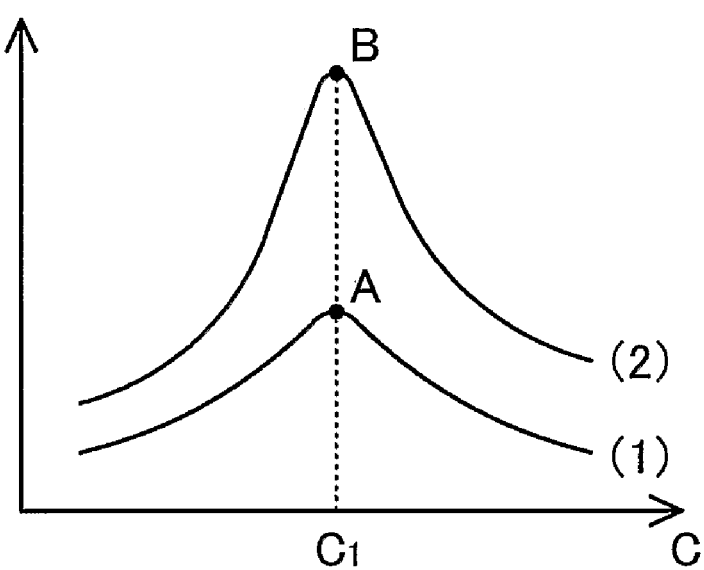
Figure 3C:
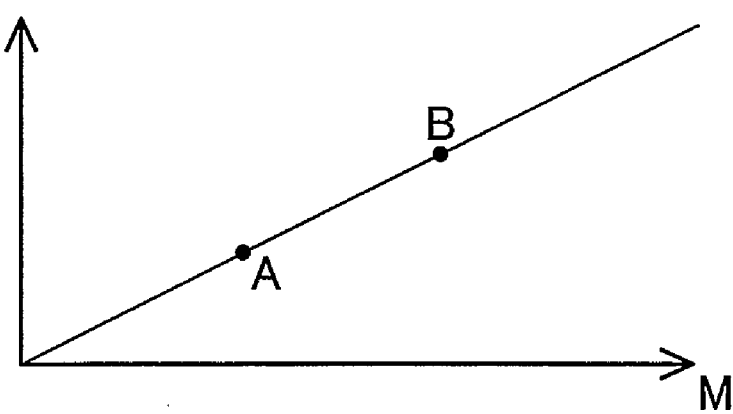

FIG. 3B shows the relation between the capacitance value C and the voltage amplitude V. Curves (1) and (2) are different in the value of the mutual inductance, and the curve (2) has a larger mutual inductance. The mutual inductance varies when the distance between or arrangement of the wireless chip and the reader is changed, and for example, the more the distance between the wireless chip and the reader is decreased, the larger the mutual inductance is. FIG. 3C shows the relation between the mutual inductance M and the voltage amplitude V. The voltage amplitude V is proportional to the mutual inductance M as shown in FIG. 3C.

Figure 4A:
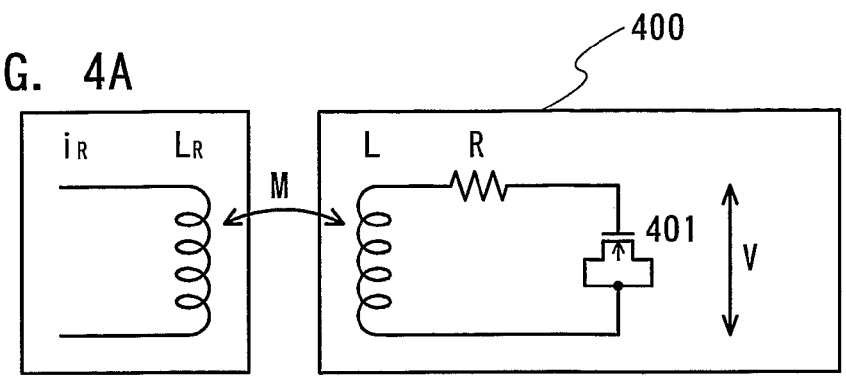
FIGS. 4A to 4D are a simplified diagram of a semiconductor device according to the present invention and graphs for explaining operation thereof.

Next, a resonant circuit that is used in the present invention will be described with reference to FIGS. 4A to 4D. FIG. 4A shows a resonant circuit including a coiled antenna with an inductance L, a resistance element with a resistance value R, and an N-type MOS capacitor element 401 that are connected in series, and shows an antenna (Inductance: $L_R$; Current: $i_R$) that powers this resonant circuit. This can be considered to be a simplified model representing a wireless chip according to the present invention and a reader.

When M, ω, and $C_{MOS}$ are assumed to respectively denote the mutual inductance between the two antennas, an angular frequency, and the capacitance value of the N-type MOS capacitor element 401 in FIG. 4A, the amplitude V of an alternating voltage induced between the opposite ends of the capacitor element is given by the formula 1 as in FIG. 3A.

Figure 4B:
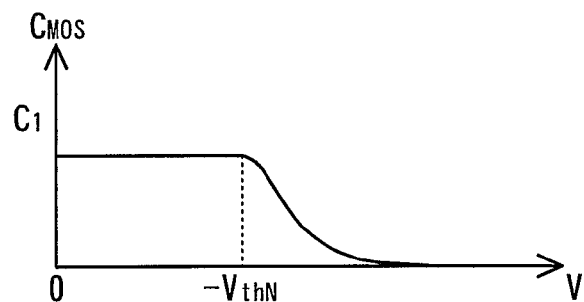

Meanwhile, when an alternating voltage is induced for a semiconductor device 400 shown in FIG. 4A, the behavior of the capacitance value $C_{MOS}$ with respect to the voltage amplitude V is represented as shown in FIG. 4B. The capacitance value $C_{MOS}$ of the N-type MOS capacitor element 401 varies depending on whether or not the voltage amplitude V is larger than the absolute value $(-V_{thn})$ of the threshold voltage. When the voltage amplitude V does not exceed the absolute value of the threshold voltage ($V < -V_{thn}$), the N-type MOS capacitor element 401 behaves as a normal capacitor element (capacitance value C1). When the voltage amplitude V exceeds the absolute value of the threshold voltage ($V > -V_{thn}$), the capacitance value of the N-type MOS capacitor element 401 is a value between C1 and 0. Then, the more the voltage amplitude V is increased, the shorter the period during which an inversion layer is formed is, and the capacitance value comes close to 0.

Figure 4C:
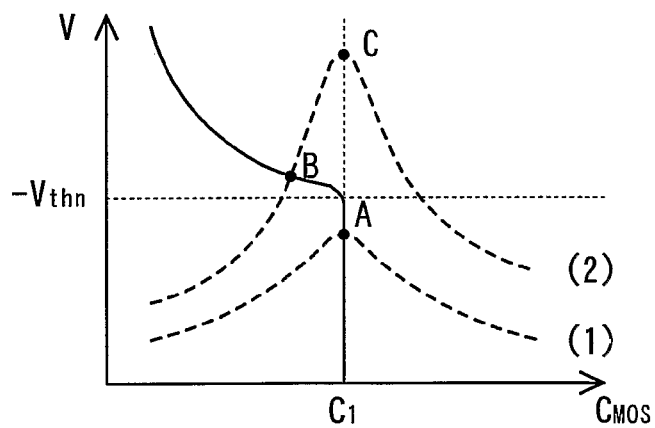

Thus, the alternating voltage amplitude V induced when the capacitance value C1 satisfies a resonance condition ($\omega^2 LC1 = 1$) is represented as in FIG. 4C. In FIG. 4C, the solid line shows the relation between the alternating voltage amplitude V and the capacitance value $C_{MOS}$. The dashed lines show the relations between alternating voltage amplitude V and the capacitance value in the case of changing the capacitance value.

The solid line in FIG. 4C corresponds to a trajectory of the voltage amplitude when the mutual inductance is changed. When the mutual inductance is small (the dashed line (1)), the voltage amplitude V is smaller than the absolute value of the threshold voltage of the N-type MOS capacitor element 401, and the capacitance value $C_{MOS}$ coincides with the capacitance value C1 (point A). Meanwhile, when the mutual inductance is increased (the dashed line (2)), for example, by bringing the wireless chip close to the reader, the voltage of the peak value (point C) of the dashed line (2) is generated in the case of a normal capacitor element. However, since the voltage amplitude V of the point C is larger than the absolute value of the threshold voltage of the N-type MOS capacitor element 401, the capacitance value $C_{MOS}$ is decreased to result in deviation from the resonance condition, and the induced voltage is thus controlled (point B).

Figure 4D:
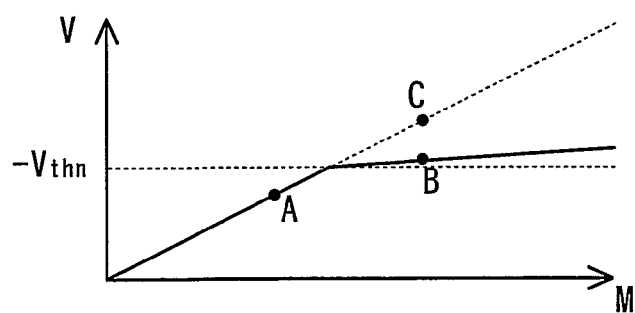

FIG. 4D shows the relation between the mutual inductance M and the voltage amplitude V. When the voltage amplitude V exceeds the absolute value of the threshold voltage of the N-type MOS capacitor element 401, the capacitance value $C_{MOS}$ is changed to deviate from the resonance condition, and the induced voltage is thus controlled. Accordingly, the voltage amplitude V and the mutual inductance M no longer have the proportional relationship.

It is to be noted that the threshold voltage of the N-type MOS capacitor element needs to be negative ($V_{th} < 0$) since it is necessary to function as a normal capacitor element when an alternating voltage with a small amplitude is applied to the MOS capacitor element.

In response to the above-described behaviors in FIGS. 4C and 4D, the present invention achieves a wireless chip that is capable of preventing an excessive voltage from being generated in the chip, namely, that has a limiter function. In addition, a power supply voltage that is supplied to a logic circuit in the wireless chip is generated based on the alternating voltage that is generated for the capacitor element. Therefore, an appropriate value for the threshold voltage of the MOS capacitor element allows the power supply voltage that is supplied to the logic circuit inside to be prevented from excessively increasing.

As described above, the present invention achieves a wireless chip with high reliability that prevents the power supply voltage that is supplied to the logic circuit inside from excessively increasing even in the case of getting close to an antenna by the use of the MOS capacitor element with a threshold voltage controlled. In addition, a wireless chip that has a small chip area can be achieved since an extra circuit such as a limiter circuit and a constant voltage generation circuit is not added.

Further, since the resonant circuit according to the present invention prevents excessive voltage generation by deviating the resonance point, power absorption itself can be prevented unlike in the case of using a limiter circuit or a constant voltage generation circuit. Accordingly, the power consumption can be reduced.

Figure 8:
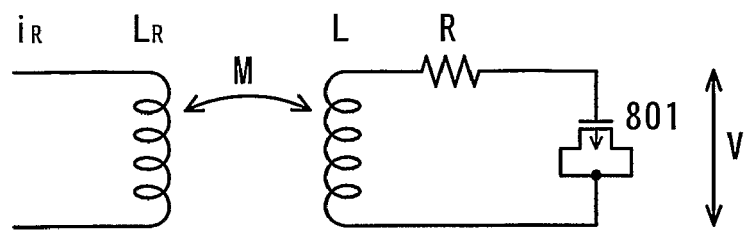
FIG. 8 is a simplified diagram of a semiconductor device according to the present invention.

It is to be noted that it is also possible to use a P-type MOS capacitor element in the present invention although the N-type MOS capacitor element is used as a MOS capacitor element in the mode shown in FIGS. 4A to 4D. In that case, a mode is represented by a circuit diagram including a P-type MOS capacitor element 801 as shown in FIG. 8. In addition, when the absolute value $(-V_{thn})$ of the threshold voltage of the N-type MOS capacitor element is changed to be regarded as the absolute value $(V_{thp})$ of the threshold voltage of the P-type MOS capacitor element, FIGS. 4B to 4D and the description of the present embodiment mode are applied without change. In particular, the present invention has a feature that the threshold voltage is positive ($V_{thp} > 0$) in the case of using a P-type MOS capacitor element.

Embodiment Mode 2

Figure 1A:
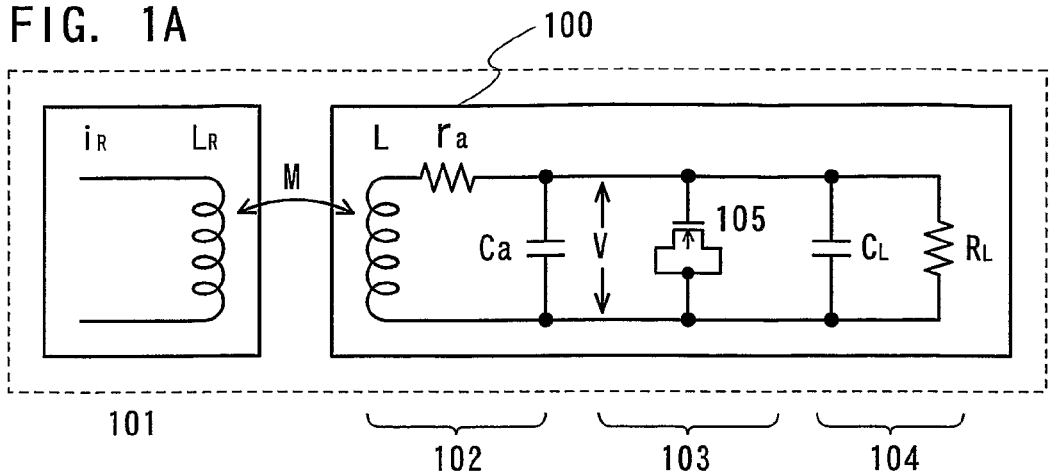
FIGS. 1A to 1D are a simplified diagram of a semiconductor device according to the present invention and graphs for explaining operation thereof.

In the present embodiment mode, a wireless chip according to the present invention will be described with reference to FIGS. 1A to 1D. FIG. 1A shows a circuit including: an antenna 102 with an inductance L, a parasitic resistance $r_a$, and a parasitic capacitance $C_a$; a resonant capacitance 103 including an N-type MOS capacitor element 105; a resistance element with a resistance value $R_L$; and a capacitor element with a capacitance value $C_L$ that are connected in parallel, and shows an antenna (Inductance: $L_R$; Current: $i_R$) that powers this circuit. The resistance element with the resistance value $R_L$; and the capacitor element with the capacitance value $C_L$ represent a circuit portion 104 of the wireless chip, and FIG. 1A can be considered to be a simplified model representing a semiconductor device 100 according to the present invention and a reader 101.

When M, ω, and $C_{tot}$ are assumed to respectively denote the mutual inductance between the two antennas, an angular frequency, and the sum of the parasitic capacitance value Ca of the antenna, the capacitance value of the N-type MOS capacitor element 105, and the capacitance value $C_L$ of the circuit portion in FIG. 1A, the amplitude V of an alternating voltage induced between the opposite ends of the capacitor element is given by a formula 2.

$$V = \frac{\omega M i_R}{\sqrt{\left(\frac{\omega L}{R_L} + \omega r_a C_{tot}\right)^2 + \left(1 - \omega^2 L C_{tot} + \frac{r_a}{R_L}\right)^2}}$$ [Formula 2]

Figure 1B:
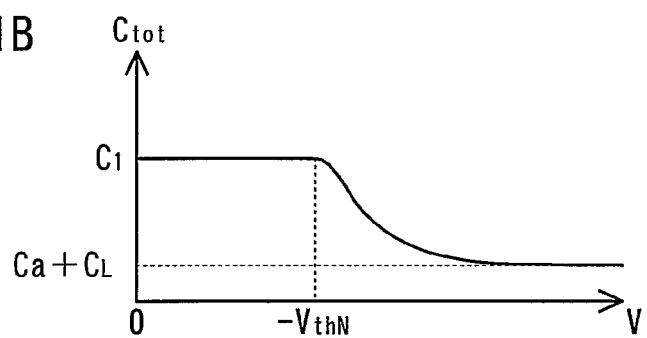

Meanwhile, when an alternating voltage is induced for the semiconductor device 100 shown in FIG. 1A, the behavior of the capacitance value $C_{tot}$ with respect to the voltage amplitude V is represented as shown in FIG. 1B. The capacitance value of the N-type MOS capacitor element 105 varies depending on whether or not the voltage amplitude V is larger than the absolute value ($-V_{thn}$) of the threshold voltage. When the voltage amplitude V does not exceed the absolute value of the threshold voltage ($V<-V_{thn}$), the N-type MOS capacitor element 105 behaves as a normal capacitor element (in the case where $C_{tot}$ is C1 when $V<-V_{thn}$ is satisfied, capacitance value is $C1-C_a-C_L$). When the voltage amplitude V exceeds the magnitude of the threshold voltage ($V>-V_{thn}$), the capacitance value of the N-type MOS capacitor element 105 is a value between $C1-C_a-C_L$ and 0. Then, the more the voltage amplitude V is increased, the shorter the period during which an inversion layer is formed is, and the capacitance value comes close to 0. Accordingly, the capacitance value of $C_{tot}$ comes close to $C_a+C_L$.

Figure 1C:
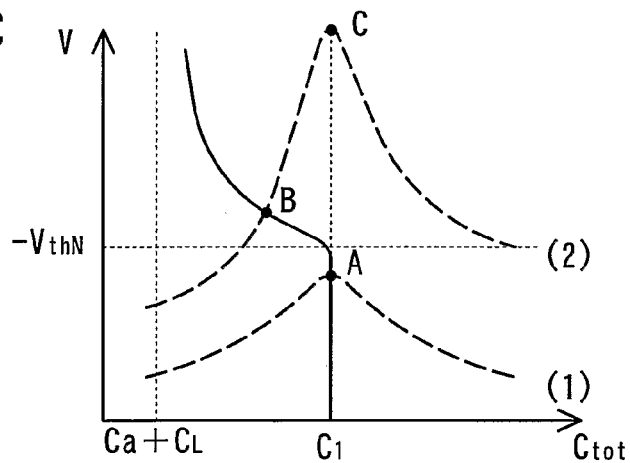

Thus, the alternating voltage amplitude V induced when the capacitance value C1 satisfies a resonance condition is represented as in FIG. 1C. In FIG. 1C, the solid line shows the relation between the alternating voltage amplitude V and the capacitance value $C_{tot}$. The dashed lines show the relations between alternating voltage amplitude V and the capacitance value in the case of changing the capacitance value.

The solid line in FIG. 1C corresponds to a trajectory of the voltage amplitude when the mutual inductance is changed. When the mutual inductance is small (the dashed line (1)), the voltage amplitude V is smaller than the absolute value of the threshold voltage of the N-type MOS capacitor element 105, and the capacitance value $C_{tot}$ coincides with the capacitance value C1 (point A). Meanwhile, when the mutual inductance is increased (the dashed line (2)), for example, by bringing the wireless chip close to the reader, the voltage of the peak value (point C) of the dashed line (2) is generated in the case of a normal capacitor element. However, since the voltage amplitude V of the point C is larger than the absolute value of the threshold voltage of the N-type MOS capacitor element 105, the capacitance value $C_{tot}$ is decreased to result in deviation from the resonance condition, and the induced voltage is thus controlled (point B).

Figure 1D:
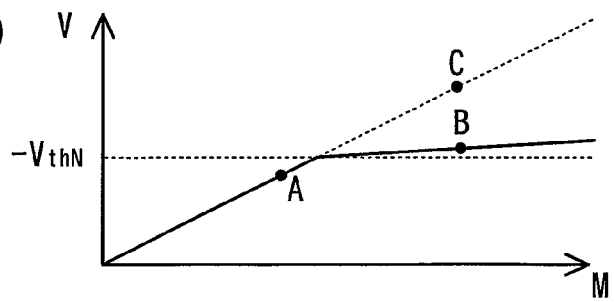
Figure 2A:
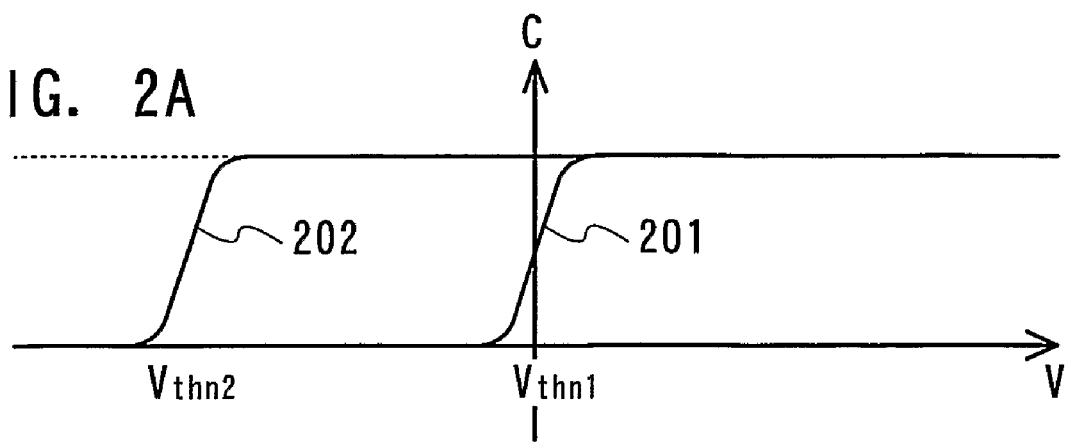
FIGS. 2A to 2C are characteristics curves of MOS capacitor elements included in semiconductor devices according to the present invention.
Figure 2B:
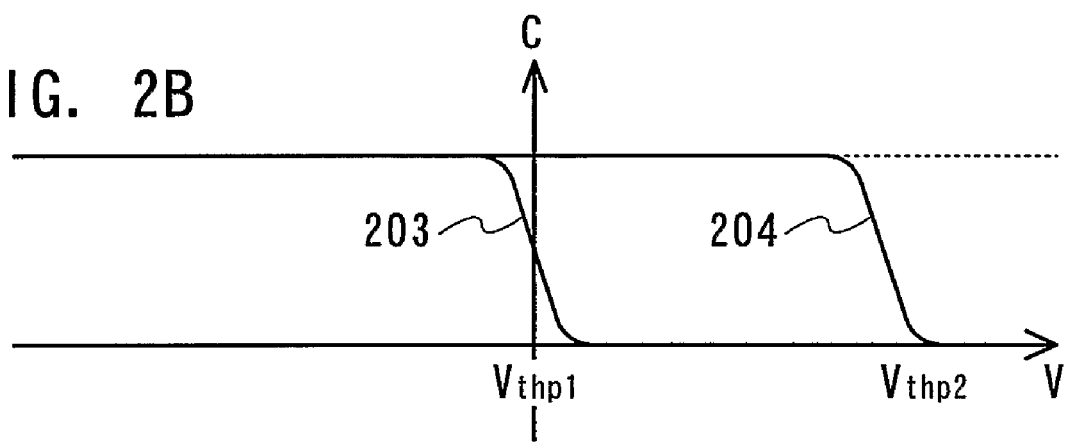
Figure 2C:
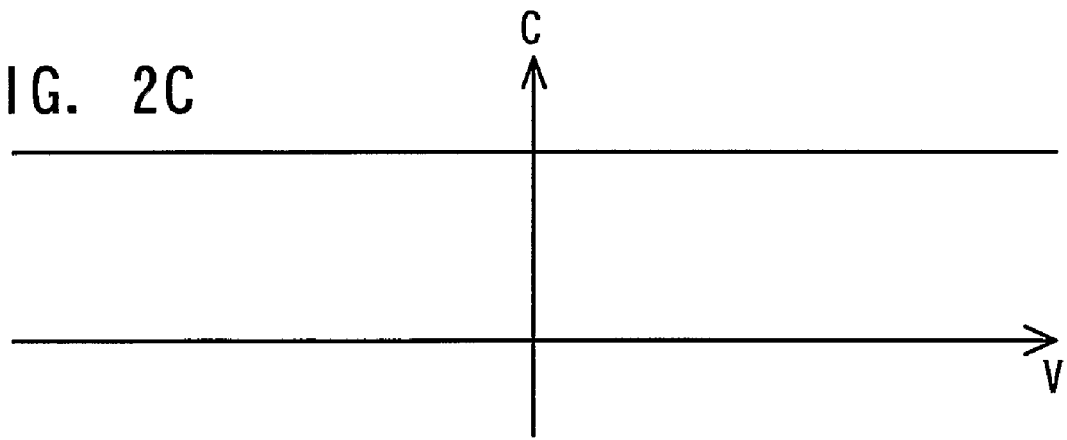

FIG. 1D shows the relation between the mutual inductance M and the voltage amplitude V. When the voltage amplitude V exceeds the threshold voltage of the N-type MOS capacitor element 105, the capacitance value $C_{tot}$ is changed to deviate from the resonance condition, and the induced voltage is thus controlled. Accordingly, the voltage amplitude V and the mutual inductance M no longer have the proportional relationship.

In response to the above-described behaviors in FIGS. 1C and 1D, the present invention achieves a wireless chip that is capable of preventing an excessive voltage from being generated in the chip, namely, that has a limiter function. In addition, a power supply voltage that is supplied to a logic circuit in the wireless chip is generated based on the alternating voltage that is generated for the capacitor element. Therefore, an appropriate value for the threshold voltage of the MOS capacitor element allows the power supply voltage that is supplied to the logic circuit inside to be prevented from excessively increasing.

As described above, the present invention achieve a wireless chip with high reliability which prevents the power supply voltage that is supplied to the logic circuit inside from excessively increasing even in the case of getting close to an antenna by the use of the MOS capacitor element with a threshold voltage controlled. In addition, a wireless chip that has a small chip area can be achieved since an extra circuit such as a limiter circuit and a constant voltage generation circuit is not added.

Further, since the resonant circuit according to the present invention prevents excessive voltage generation by deviating the resonance point, power absorption itself can be prevented unlike in the case of using a limiter circuit or a constant voltage generation circuit. Accordingly, the power consumption can be reduced.

Figure 9:
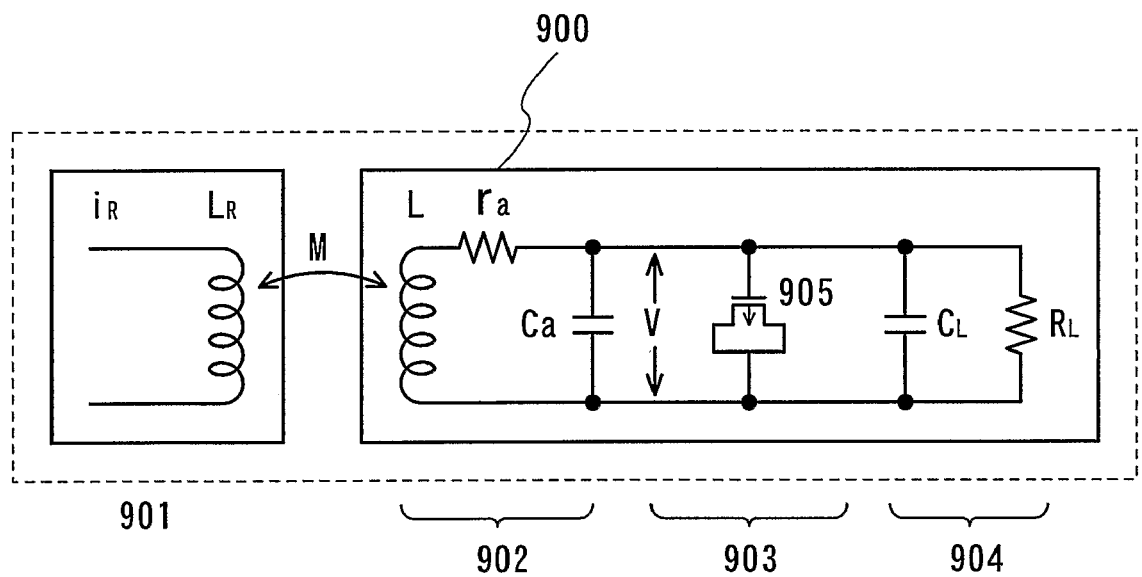
FIG. 9 is a simplified diagram of a semiconductor device according to the present invention.

It is to be noted that it is also possible to use a P-type MOS capacitor element in the present invention although the N-type MOS capacitor element is used as a MOS capacitor element in the mode shown in FIGS. 1A to 1D. In that case, a mode is represented by a circuit diagram including a semiconductor device 900 that has an antenna 902, a resonant circuit 903, and a circuit portion 904 and including a reader 901, as shown in FIG. 9. The resonant circuit 903 has a P-type MOS capacitor element 905. In addition, when the absolute value ($-V_{thn}$) of the threshold voltage of the N-type MOS capacitor element is changed to be regarded as the absolute value ($V_{thp}$) of the threshold voltage of the P-type MOS capacitor element, FIGS. 1B to 1D and the description of the present embodiment mode are applied without change.

Embodiment Mode 3

Figure 5:
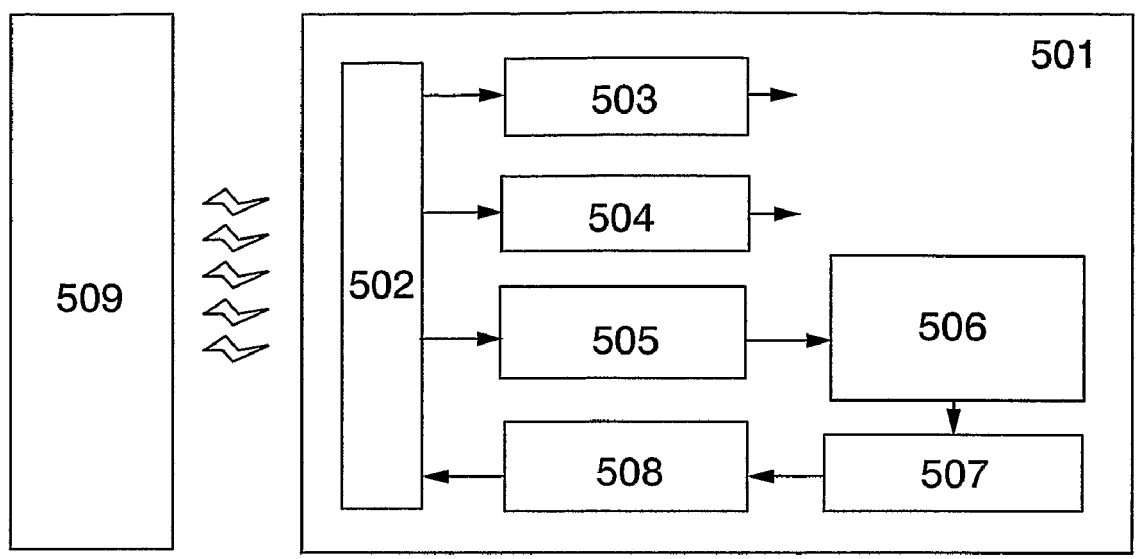
FIG. 5 is a block diagram of a semiconductor device according to the present invention.

FIG. 5 shows the configuration of a semiconductor device according to the present invention. A semiconductor device 501 according to the present invention is powered by electromagnetic waves emitted from a reader 509, and wirelessly transmits and receives data with the reader. In addition, not shown in the figure, the reader may be connected to a computer via communication lines to transmit and receive data with the semiconductor device under the control of the computer.

The semiconductor device 501 has a resonant circuit 502 including a MOS capacitor element, a power supply circuit 503, a clock generation circuit 504, a demodulating circuit 505, a control circuit 506, a memory portion 507, and an encoding and modulating circuit 508. An antenna is electrically connected to the MOS capacitor element in the resonant circuit. As for the antenna, either an antenna included in the semiconductor device 501, or an external antenna electrically connected to the MOS capacitor element through a connecting terminal is employed.

In the resonant circuit 502, an alternating voltage is induced when an electromagnetic wave emitted from the reader 509 is received. This alternating voltage includes transmitted data from the reader, and is also the basis for a power supply and a clock signal for the semiconductor device 501.

The power supply circuit 503 rectifies the alternating voltage generated in the resonant circuit 502 with a rectifying element, and supplies a power supply stabilized with the use of a capacitor element to each circuit. Based on the alternating voltage generated in the resonant circuit 502, the clock generation circuit 504 generates a clock signal with a predetermined frequency. The demodulating circuit 505 demodulates data in response to the alternating voltage generated in the resonant circuit 502. The control circuit 506 controls the memory portion 507 to carry out reading from the memory, writing into the memory, and the like in accordance with the demodulated data. The memory portion 507 is made up of non-volatile EEPROM and FeRAM, a volatile SRAM, and the like, and it is preferable that the memory portion 507 have at least a non-volatile memory. Data that is specific to the semiconductor device 501 and the like are held in the non-volatile memory. The encoding and modulating circuit 508 converts data to be transmitted into an encoded signal, and modulates a carrier wave.

It is to be noted that the semiconductor device 501 may include an antenna or may have a terminal to which an antenna is connected. In addition, the semiconductor device 501 is not limited to the configuration described above, and may have an information determining circuit, a central processing unit (CPU), a congestion control circuit, and the like. Although the passive configuration without a battery is described, an active configuration with a battery may be used.

The power supply circuit 503 generates a power supply VDD and supplies the power supply to each circuit. A wireless chip has the range of $V_{min}$ to $V_{max}$ in power supply voltage VDD for guaranteeing reliable operation. The values of these minimum operation power supply voltage $V_{min}$ and maximum operation power supply voltage $V_{max}$ depend on integrated circuit technology, and in the case of an integrated circuit formed on single crystalline silicon, $V_{min}$ and $V_{max}$ are approximately 0.2 to 1 V and approximately 1 to 5 V, respectively. In addition, in the case of an integrated circuit formed on a glass substrate or a flexible substrate, $V_{min}$ and $V_{max}$ are approximately 1 to 4 V and approximately 3 to 12 V, respectively.

In response to these ranges of the power supply voltage, the present invention achieves a wireless chip that is capable of preventing a voltage inside from excessively increasing by the use of a MOS capacitor element with a predetermined threshold voltage without providing limiter circuit or a constant voltage generation circuit. The present invention is effective when the predetermined threshold voltage is in the range of −0.1 V to −24 V in the case of an N-type MOS capacitor element and is in the range of 0.1 V to 24 V in the case of a P-type MOS capacitor element. In particular, in the case of forming the MOS capacitor element on a glass substrate or a flexible substrate that has an integrated circuit with a gate length of 2 µm or less, it is preferable that the predetermined threshold voltage be −2 V to −15 V (N-type MOS capacitor element) and be 2 V to 15 V (P-type MOS capacitor element).

Embodiment 1

Examples of a power supply circuit included in a wireless chip according to the present invention will be described with reference to FIGS. 6A to 6C and FIGS. 7A to 7C.

FIG. 6A shows a configuration example of a half-wave-rectification power supply circuit. The power supply circuit has two input terminals that are connected to the opposite ends of an antenna or thereto through a capacitor element or the like, two output terminals that output GND and VDD, two diodes 601 and 602, and a capacitor element 603. One of the two inputs and one of the two outputs are directly connected to have the ground voltage GND. In the power supply circuit that has the configuration, when an alternating signal to be input is as shown in FIG. 6B, the output is as shown in FIG. 6C and the power supply voltage VDD is ($2 \times V - 2 \times V_{thd}$) or less. It is to be noted that $V_{thd}$ indicates the threshold voltage of the diode.

FIG. 7A shows a configuration example of a full-wave-rectification power supply circuit. The power supply circuit has two input terminals that are connected to the opposite ends of an antenna or thereto through a capacitor element or the like, two output terminals that output GND and VDD, four diodes 611, 612, 613, and 614, and a capacitor element 615. In the power supply circuit that has the configuration, when an alternating signal to be input is as shown in FIG. 7B, the output is as shown in FIG. 7C, and the power supply voltage VDD is approximately $V - 2 \times V_{thd}$. It is to be noted that $V_{thd}$ indicates the threshold voltage of the diode.

The wireless chip has the range of $V_{min}$ to $V_{max}$ in power supply voltage for guaranteeing reliable operation. In the case of using a resonant circuit according to the present invention, the suppressive action is exerted when the alternating voltage amplitude V is equal to or more than the absolute value $V_{th}$ of the threshold voltage of the MOS capacitor element. Therefore, it is preferable that the voltage $V_{min}$ to $V_{max}$ and the absolute value $V_{th}$ of the threshold voltage have the following relationship.

First, in order to carry out operation with high reliability without damaging the circuit portion, it is necessary to suppress the power supply voltage to be generated to $V_{max}$ or less. Accordingly, it is preferable that the power supply voltage be $2 \times V_{th} - 2 \times V_{thd} < V_{max}$ in the power supply circuit shown in FIG. 6A and $V_{th} - 2 \times V_{thd} < V_{max}$ in the power supply circuit shown in FIG. 7A.

In addition, when the generated voltage is controlled by the MOS capacitance and is equal to or less than the operation guarantee voltage, the situation where the wireless chip does not operate even when the wireless chip is brought close to a reader is caused. In order to avoid this situation, it is preferable that the power supply voltage be $V_{min} < 2 \times V_{th} - 2 \times V_{thd}$ in the power supply circuit shown in FIG. 6A and $V_{min} < V_{th} - 2 \times V_{thd}$ in the power supply circuit shown in FIG. 7A.

In addition, expressed in another way, it can be said that it is preferable to use MOS capacitor elements having $V_{th}$ that satisfies a formula 3 for a wireless chip that has the half-wave-rectification power supply circuit and $V_{th}$ that satisfies a formula 4 for a wireless chip that has the full-wave-rectification power supply circuit, respectively. It is to be noted that $V_{th}$ indicates the absolute value of the threshold voltage of the MOS capacitor element.

$$\frac{V_{min}}{2} + V_{thd} < V_{th} < \frac{V_{max}}{2} + V_{thd} \quad \text{[Formula 3]}$$

$$V_{min} + 2V_{thd} < V_{th} < V_{max} + 2V_{thd} \quad \text{[Formula 4]}$$

Further expressed in another way, it can be said that it is preferable to use a MOS capacitor element that has $V_{th}$ that satisfies a formula 5 when the relation VDD=c×V is satisfied between the alternating voltage amplitude V and the power supply voltage VDD. Since the coefficient c is typically in the range of ¼ to 1, it is preferable to a MOS capacitor element that has $V_{th}$ that satisfies a formula 6.

$$\frac{V_{min}}{2c} < V_{th} < \frac{V_{max}}{2c} \quad \text{[Formula 5]}$$

$$\frac{V_{min}}{2} < V_{th} < 2V_{max} \quad \text{[Formula 6]}$$

Depending on integrated circuit technology, in the case of an integrated circuit formed on a single crystalline silicon substrate, $V_{min}$ and $V_{max}$ are approximately 0.2 to 1 V and approximately 1 to 5 V, respectively. In addition, in the case of an integrated circuit formed on a glass substrate, $V_{min}$ and $V_{max}$ are approximately 1 to 4 V and approximately 3 to 12 V, respectively. Accordingly, it is preferable that the threshold voltage of the MOS capacitor element included in the present invention be −0.1 V to −24 V (N-type MOS capacitor element) and be 0.1 V to 24 V. (P-type MOS capacitor element). In particular, in the case of forming the MOS capacitor element on a single crystalline silicon substrate, it is preferable that the threshold voltage be −0.1 V or more or −10 V or less (N-type MOS capacitor element) and be 0.1 V or more and 10 V or less (P-type MOS capacitor element). In the case of forming the MOS capacitor element on a glass substrate or a flexible substrate, it is preferable that the threshold voltage be −0.5 V to −24 V (N-type MOS capacitor element) and be 0.5 V to 24 V (P-type MOS capacitor element). In particular, in the case of forming the MOS capacitor element on a glass substrate or a flexible substrate that has an integrated circuit with a gate length of 2 μm or less, it is preferable that the predetermined threshold voltage be −2 V to −15 V (N-type MOS capacitor element) and be 2 V to 15 V (P-type MOS capacitor element).

Embodiment 2

Figure 10A:
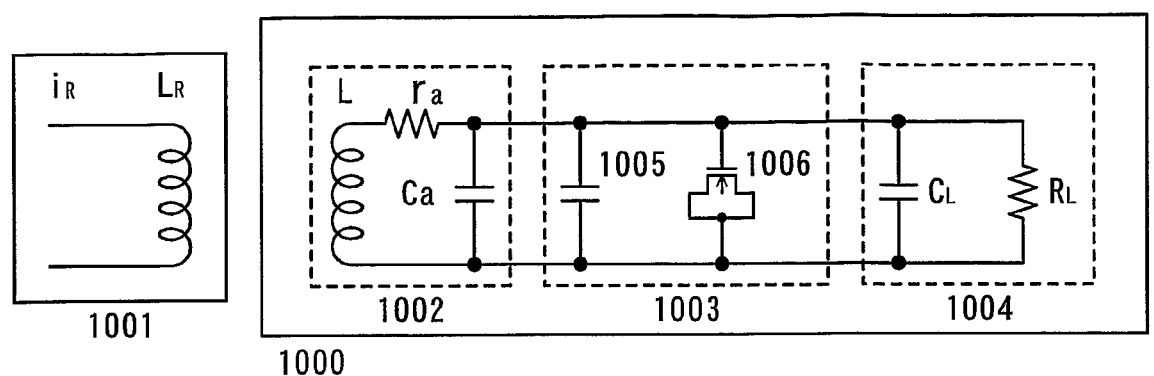
FIGS. 10A and 10B are a simplified diagram of a semiconductor device according to the present invention and a graph for explaining operation thereof.

Another configuration example of the present invention will be described with reference to FIGS. 10A and 10B. The example shown in FIG. 10A is an example of using a normal capacitor element 1005 and an N-type MOS capacitor element 1006 (threshold voltage: $V_{thn}<0$) to arrange a resonant circuit, and is different from the circuit shown in FIG. 1A in the configuration of the capacitor element. FIG. 10A shows a semiconductor device 1000 including an antenna 1002, a resonant circuit 1003, and a circuit portion 1004 and shows a reader 1001. The total of the parasitic capacitance value $C_a$ of the antenna, the capacitance value of the normal capacitor element 1005, the capacitance value of the N-type MOS capacitor element 1006, and the capacitance value $C_L$ of the circuit portion is represented by $C_{tot}$.

Figure 10B:
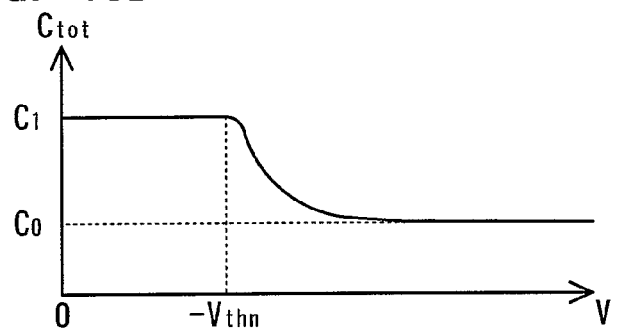

In the case of using the two types of capacitor elements 1005 and 1006 shown in FIG. 10A, the relation between the capacitance value $C_{tot}$ and an alternating voltage amplitude V is represented as in FIG. 10B. The capacitance value $C_{tot}$ can be considered by separation into a capacitance value C0 of a constant value represented by the sum of the parasitic capacitance value $C_a$ of the antenna, the capacitance value of the normal capacitor element 1005, and the capacitance value $C_L$ of the circuit portion and into the capacitance value C1−C0 of the N-type MOS capacitor element 1006. Here, C1 is a capacitance value of $C_{tot}$ when the voltage amplitude V does not exceed the absolute value of the threshold voltage of the N-type MOS capacitor element 1006 (V<−$V_{thn}$). Besides, in comparison with FIG. 1A, it is understood that the qualitative behavior is similar to FIG. 1B since the component of C0 is the only difference.

As shown in FIG. 10B, the capacitance value $C_{tot}$ varies depending on whether or not the voltage amplitude V is larger than the absolute value (−$V_{thn}$) of the threshold voltage of the N-type MOS capacitor element 1006. When the voltage amplitude V does not exceed the absolute value of the threshold voltage of the N-type MOS capacitor element 1006 (V<−$V_{thn}$), the N-type MOS capacitor element 1006 behaves as a normal capacitor element (capacitance value: C1−C0). When the voltage amplitude V exceeds the absolute value of the threshold voltage (V>−$V_{thn}$), the capacitance value of the N-type MOS capacitor element 1006 is a value between C1−C0 and 0. Then, the more the voltage amplitude V is increased, the shorter the period during which an inversion layer is formed is, and the capacitance value comes close to 0. Accordingly, the capacitance value of $C_{tot}$ comes close to C0.

It is determined from the behavior in FIG. 10B that when the capacitance value C1 satisfies the resonant condition of the semiconductor device 1000 shown in FIG. 10A, the resonant condition is satisfied when the induced voltage amplitude V is small while the capacitance value varies to deviate from the resonant condition when the induced voltage amplitude V is increased to exceed the absolute value of the threshold voltage of the MOS capacitor element. Accordingly, the induced voltage amplitude is controlled.

As described above, the semiconductor device 1000 shown in FIG. 10A achieves a wireless chip that is capable of preventing an excessive voltage from being generated in the chip, namely, that has a limiter function. In addition, a power supply voltage that is supplied to a logic circuit in the wireless chip is generated based on the alternating voltage that is generated for the capacitor element. Therefore, an appropriate value for the threshold voltage of the MOS capacitor element allows the power supply voltage that is supplied to the logic circuit inside to be prevented from excessively increasing.

As described above, the present invention achieves a wireless chip with high reliability which prevents the power supply voltage that is supplied to the logic circuit inside from excessively increasing even in the case of getting close to an antenna by the use of the MOS capacitor element with a threshold voltage controlled. In addition, a wireless chip that has a small chip area can be achieved since an extra circuit such as a limiter circuit and a constant voltage generation circuit is not added.

It is to be noted that it is also possible to use a P-type MOS capacitor element in the present invention although the N-type MOS capacitor element is used as a MOS capacitor element in the present embodiment. In this case, when −$V_{thn}$ in FIG. 10B is changed to be regarded as $V_{thp}$, the graph of FIG. 10B is applied to the P-type MOS capacitor element.

In addition, an example of connecting one N-type MOS capacitor element and one normal capacitor element in parallel as capacitor elements is shown in the present embodiment. Of course, a plurality of N-type MOS capacitor elements and a plurality of normal capacitor elements may be connected in parallel.

Embodiment 3

Figure 11A:
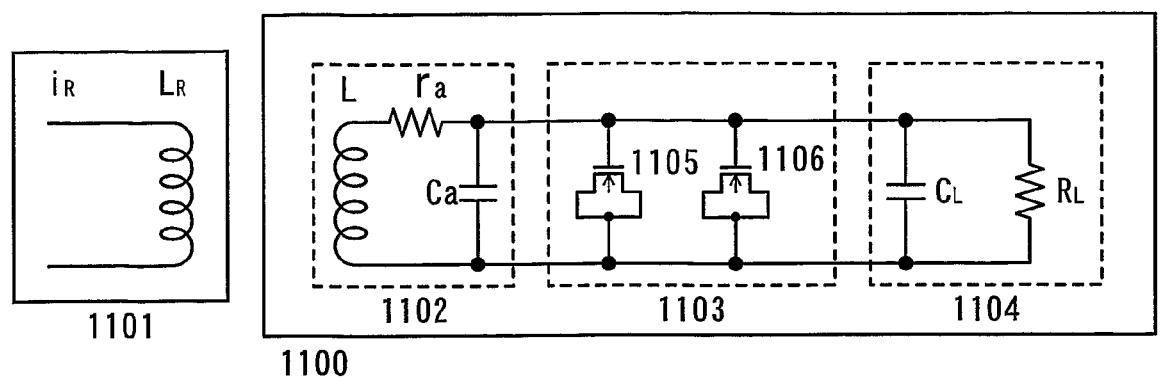
FIGS. 11A and 11B are a simplified diagram of a semiconductor device according to the present invention and a graph for explaining operation thereof.

Another configuration example of the present invention will be described with reference to FIGS. 11A and 11B. The example shown in FIG. 11A is an example of using two N-type MOS capacitor elements 1105 and 1106 that have different threshold voltages to arrange a resonant circuit, and is different from the circuit shown in FIG. 1A in the configuration of the capacitor element. FIG. 11A shows a semiconductor device 1100 including an antenna 1102, a resonant circuit 1103, and a circuit portion 1104 and shows a reader 1101. The N-type MOS capacitor elements 1105 and 1106 respectively have threshold voltages $V_{thn1}$ and $V_{thn2}$, and $V_{thn2}<V_{thn1}<0$ is to be satisfied. The total of the parasitic capacitance value $C_a$ of the antenna, the capacitance values of the N-type MOS capacitor elements 1105 and 1106, and the capacitance value $C_L$ of the circuit portion is represented by $C_{tot}$.

Figure 11B:
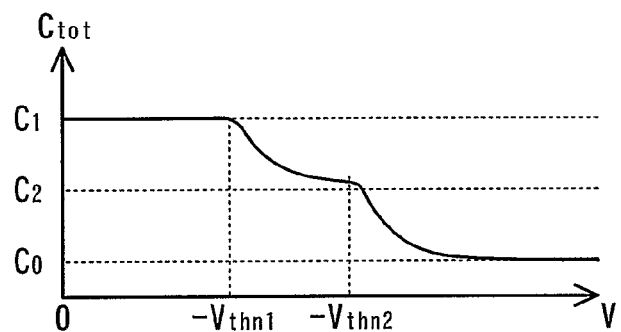

In the case of using the two N-type MOS capacitor elements 1105 and 1106 that have different threshold voltages, which are shown in FIG. 11A, the relation between the capacitance value $C_{tot}$ and an alternating voltage amplitude V is represented as in FIG. 11B. The capacitance value $C_{tot}$ can be considered by separation into a capacitance value C0 of a constant value represented by the sum of the parasitic capacitance value $C_a$ of the antenna and the capacitance value $C_L$ of the circuit portion, into the capacitance value C1–C2 of the N-type MOS capacitor element 1105, and into the capacitance value C2–C0 of the N-type MOS capacitor element 1106. Here, C1 is a sum of the capacitance value C0, the capacitance value of the N-type MOS capacitor element 1105 and the capacitance value of the N-type MOS capacitor element 1106, namely a capacitance value of $C_{tot}$ when the voltage amplitude V does not exceed the absolute value of the threshold voltage of the N-type MOS capacitor element 1105 (V<–$V_{thn1}$), and C2 is a sum of the capacitance value C0 and the capacitance value of the N-type MOS capacitor element 1106 when the voltage amplitude V does not exceed the absolute value of the threshold voltage of the N-type MOS capacitor element 1106 (V<–$V_{thn2}$)

The capacitance value of the N-type MOS capacitor element 1105 varies depending on whether or not the voltage amplitude V is larger than the absolute value (–$V_{thn1}$) of the threshold voltage. When the voltage amplitude V does not exceed the magnitude of the threshold voltage (V<–$V_{thn1}$), the N-type MOS capacitor element 1105 behaves as a normal capacitor element (capacitance value: C1–C2). When the voltage amplitude V exceeds the magnitude of the threshold voltage (V>–$V_{thn1}$), the capacitance value of the N-type MOS capacitor element 1105 is a value between C1–C2 and 0. Then, the more the voltage amplitude V is increased, the shorter the period during which an inversion layer is formed is, and the capacitance value comes close to 0. Accordingly, the capacitance value of $C_{tot}$ comes close to C2.

Similarly, the capacitance value of the N-type MOS capacitor element 1106 varies depending on whether or not the voltage amplitude V is larger than the absolute value (–$V_{thn2}$) of the threshold voltage. When the voltage amplitude V does not exceed the magnitude of the threshold voltage (V<–$V_{thn2}$), the N-type MOS capacitor element 1106 behaves as a normal capacitor element (capacitance value: C2–C0). When the voltage amplitude V exceeds the magnitude of the threshold voltage (V>–$V_{thn2}$), the capacitance value of the N-type MOS capacitor element 1106 is a value between C2–C0 and 0. Then, the more the voltage amplitude V is increased, the shorter the period during which an inversion layer is formed is, and the capacitance value comes close to 0. Accordingly, the capacitance value of $C_{tot}$ comes close to C0.

Thus, it is understood that it is FIG. 11B that shows the relation between the capacitance value $C_{tot}$ and the alternating voltage amplitude V.

It is determined from the behavior in FIG. 11B that when the capacitance value C1 satisfies the resonant condition of the semiconductor device 1100 shown in FIG. 11A, the resonant condition is satisfied when the induced voltage amplitude V is small while the capacitance value varies to deviate from the resonant condition when the induced voltage amplitude V is increased to exceed the absolute value of the threshold voltage of the N-type MOS capacitor element 1105. In addition, when the voltage amplitude V is further increased to exceed the absolute value of the threshold voltage of the N-type MOS capacitor element 1106, the capacitance value further varies to be away from the resonant condition. Accordingly, the induced voltage amplitude is controlled.

As described above, the semiconductor device 1100 shown in FIG. 11A achieves a wireless chip that is capable of preventing an excessive voltage from being generated in the chip, namely, that has a limiter function. In addition, a power supply voltage that is supplied to a logic circuit in the wireless chip is generated based on the alternating voltage that is generated for the capacitor element. Therefore, an appropriate value for the threshold voltage of the MOS capacitor element allows the power supply voltage that is supplied to the logic circuit inside to be prevented from excessively increasing.

It is to be noted that it is also possible to use a P-type MOS capacitor element in the present invention although the N-type MOS capacitor element is used as a MOS capacitor element in the present embodiment. In this case, when –$V_{thn1}$ and –$V_{thn2}$ in FIG. 11B are changed to be regarded as $V_{thp1}$ and $V_{thp2}$, respectively, the graph of FIG. 11B is applied to the P-type MOS capacitor element.

In addition, it is also possible in the present invention to use both an N-type MOS capacitor element and a P-type MOS capacitor element. Further, a plurality of N-type MOS capacitor elements, a plurality of P-type MOS capacitor elements, or a plurality of normal capacitor elements may be connected in parallel.

Embodiment 4

Figure 12:
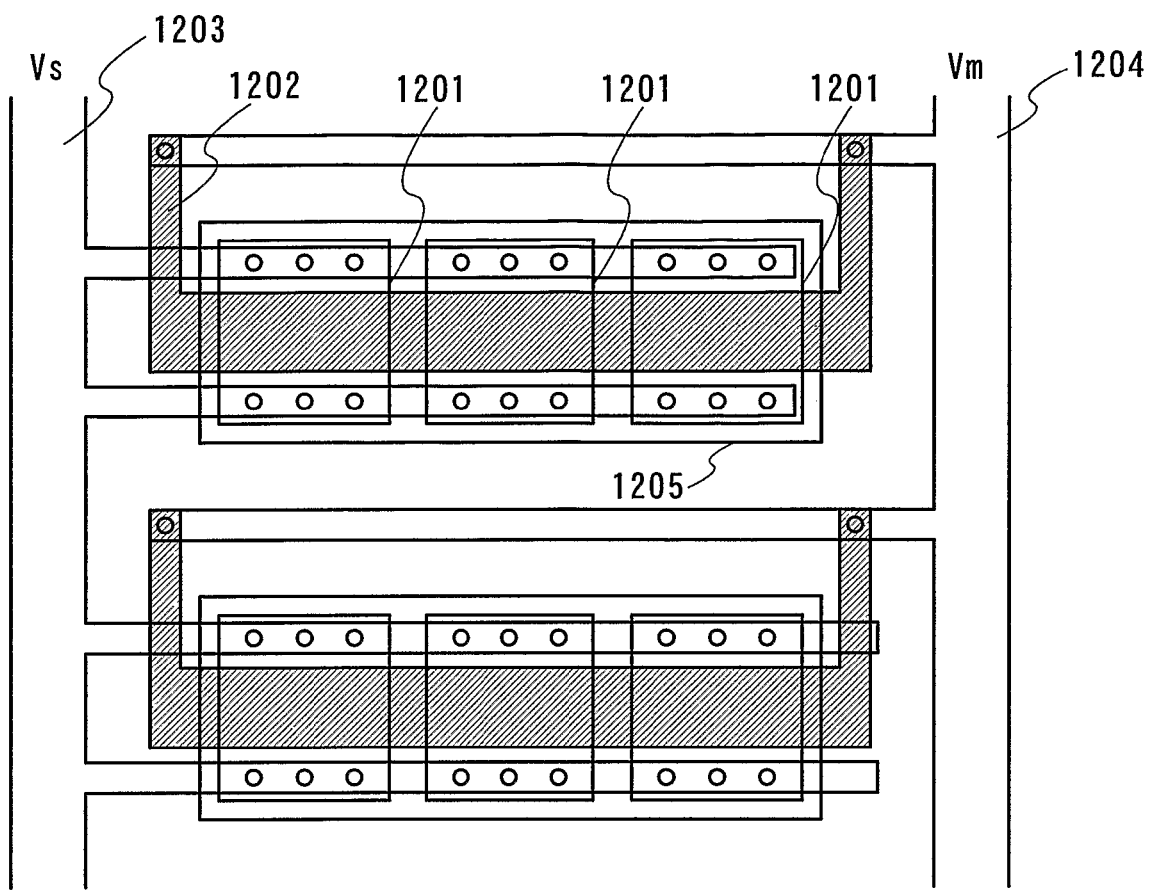
FIG. 12 is a layout diagram of a MOS capacitor element included in a semiconductor device according to the present invention.

A layout example of a MOS capacitor element according to the present invention will be described. FIG. 12 shows a layout example of a MOS capacitor element that is used in the present invention.

In FIG. 12, a region 1201 and a region 1202 denote semiconductor region and a gate electrode, respectively. Regions 1203 and 1204 are wiring regions, and are connected to the semiconductor region and the gate electrode, respectively. A region 1205 is a region that is doped with an impurity element, and is doped with an N-type impurity element for an N-type MOS capacitor element or a P-type impurity element for a P-type MOS capacitor element.

The use of a MOS capacitor element that has this layout allows a semiconductor device according to the present invention to be achieved.

Embodiment 5

A method for manufacturing a semiconductor device according to the present invention will be described with reference to the drawings. More specifically, a method for manufacturing a semiconductor device including N-type and P-type thin film transistors, an N-type MOS capacitor element, and a conductive layer that functions as an antenna will be described with reference to drawings. It is to be noted that the thin film transistors are elements constituting each circuit constituting a semiconductor device, such as a power supply circuit.

A separation layer 702 is formed over a surface of a substrate 701 (also referred to as a base) (see FIG. 13A). The substrate 701 has an insulating surface. When the substrate 701 includes a plastic, it is necessary to use a heat-resistant plastic that is resistant to processing temperatures in the manufacturing process. As described below, it is preferable to form a thin film transistor over the substrate 701 including glass, separate the thin film transistor, and provide the separated thin film transistor over a substrate including a plastic.

It is to be noted that the separation layer 702 is formed over the entire surface of the substrate 701 in this process. However, after forming a separation layer over the entire surface of the substrate 701, the separation layer may be processed, that is, patterned by using a photolithography method, an etching method, or the like to be selectively provided, if necessary. In addition, although the separation layer 702 is formed to have contact with the substrate 701, an insulating layer to serve as a base may be formed to have contact with the substrate 701 if necessary, and the separation layer 702 may be formed to have contact with the insulating layer.

For the separation layer 702, a single layer or stacked layers are formed by sputtering, plasma CVD, or the like with the use of a layer including an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), and the like; or an alloy material or a compound material containing the element as its main component. The layer containing silicon may have any crystal structure of an amorphous structure, a microcrystalline structure, and a polycrystalline structure.

Next, an insulating layer 703 to serve as a base is formed to cover the separation layer 702. For the insulating layer 703, a single layer or stacked layers are formed by sputtering, plasma CVD, or the like with the use of a layer including an oxide of silicon or a nitride of silicon. The oxide material of silicon is a substance containing silicon (Si) and oxygen (O), which corresponds to silicon oxide, silicon oxide containing nitrogen, and the like. The nitride material of silicon is a substance containing silicon and nitrogen (N), which corresponds to silicon nitride, silicon nitride containing oxygen, and the like. The insulating layer to serve as a base functions as a blocking film that prevents penetration of impurities from the substrate 701.

Next, an amorphous semiconductor layer 704 is formed over the insulating layer 703. The amorphous semiconductor layer 704 is formed by sputtering, LPCVD, plasma CVD, or the like. Subsequently, the amorphous semiconductor layer 704 is crystallized by laser crystallization, thermal crystallization using RTA or an annealing furnace, thermal crystallization using a metal element that promotes crystallization, laser crystallization in combination with thermal crystallization using a metal element that promotes crystallization, or the like to form a crystalline semiconductor layer. Thereafter, the obtained crystalline semiconductor layer is patterned into a desired shape to form crystalline semiconductor layers 706 to 708 (see FIG. 13B).

An example of the manufacturing process for the crystalline semiconductor layers 706 to 708 will be described below. First, an amorphous semiconductor layer is formed by plasma CVD. After a solution containing nickel that is a metal element that promotes crystallization is retained on the amorphous semiconductor layer, the amorphous semiconductor layer is subjected to a dehydrogenation treatment (at 500° C. for 1 hour) and thermal crystallization (at 550° C. for 4 hours) to form a crystalline semiconductor layer. Then, the crystalline semiconductor layer is irradiated with laser light if necessary, and patterned by using photolithography, an etching method, or the like to form the crystalline semiconductor layers 706 to 708. In the case of forming the crystalline semiconductor layers 706 to 708 by laser crystallization, a gas laser or a solid-state laser is used, which may be either a continuous-wave laser or a pulsed laser.

Crystallization of the amorphous semiconductor layer with the use of a metal element that promotes crystallization has the advantages that crystallization can be carried out at low temperature in a short time and crystals can be aligned in the same direction while having the disadvantage that the off-current increases since the metal element remains in the crystalline semiconductor layers to result in unstable characteristics. Accordingly, an amorphous semiconductor layer to function as a gettering site is preferably formed on the crystalline semiconductor layers. The amorphous semiconductor layer to function as a gettering site is required to include impurity elements such as phosphorus and argon, and is thus preferably formed by sputtering that is capable of making the amorphous semiconductor layer include argon at a high concentration. Then, the metal element is diffused in the amorphous semiconductor layer by a heat treatment (such as thermal annealing using RTA or an annealing furnace), and the amorphous semiconductor layer containing the metal element is subsequently removed. As a result, the metal element in the crystalline semiconductor layers can be reduced or removed.

Next, a gate insulating layer 705 is formed to cover the crystalline semiconductor layers 706 to 708. For the gate insulating layer 705, a single layer or stacked layers are formed by plasma CVD, sputtering, or the like with the use of a layer including an oxide of silicon or a nitride of silicon.

In particular, the use of a high-density plasma treatment for manufacture allows a high-quality gate insulating film to be formed. The high-density plasma treatment is a plasma treatment that is carried out with a plasma density of $1 \times 10^{11}$ cm$^{-3}$ or more, preferably $1 \times 10^{11}$ to $9 \times 10^{15}$ cm$^{-3}$, by using a high frequency such as microwaves (for example, a frequency of 2.45 GHz). Generation of plasma under this condition results in a low electron temperature from 0.2 to 2 eV. Since active species have low kinetic energy in the high-density plasma characterized by this low electron temperature, a film with little plasma damage and few defects can be formed. In a deposition chamber in which such a plasma treatment can be carried out, an object on which a film is to be formed, the substrate with the patterned semiconductor film formed for the case of forming a gate insulating film, is placed. Then, a deposition treatment is carried out while the distance between an electrode for generating plasma, i.e., an antenna and the object on which a film is to be formed is made to be 20 to 80 mm, preferably 20 to 60 mm. Such a high-density plasma treatment allows a low-temperature process (substrate temperature: 400° C. or less) to be achieved. Therefore, a film can be formed also over a plastic substrate that has low heat resistance as compared with a glass substrate and a single-crystalline silicon substrate.

The deposition atmosphere for such an insulating film may be a nitrogen atmosphere or an oxygen atmosphere. The nitrogen atmosphere is typically a mixed atmosphere of nitrogen and rare gas or a mixed atmosphere of nitrogen, hydrogen, and rare gas. As the rare gas, at least one of helium, neon, argon, krypton, and xenon can be used. The oxygen atmosphere is typically a mixed atmosphere of oxygen and rare gas, a mixed atmosphere of oxygen, hydrogen, and rare gas, or a mixed atmosphere of dinitrogen monoxide and rare gas. As the rare gas, at least one of helium, neon, argon, krypton, and xenon can be used.

The thus formed insulating film is a dense film with little damage to another film. In addition, the insulating film formed by a high-density plasma treatment allows the condition of an interface in contact with the insulating film to be improved. For example, when a high-density plasma treatment is used to form the gate insulating film, the condition of interfaces between the semiconductor films and the gate insulating film can be improved. Accordingly, leak current of the gate insulating film is reduced so that electrical characteristics of the thin film transistors can be improved. In addition, since the gate insulating film is allowed to be thinner, it is possible to suppress short channel effect, suppress variations in threshold voltage, improve the drive currents of the thin film transistors, and the like. In addition, miniaturization of the thin film transistors is allowed as the gate insulating film is made thinner.

In addition, in the MOS capacitor element of the present invention, the use of the gate insulating film formed by the high-density plasma treatment as described above reduces leak current of the MOS capacitor element. In addition, the gate insulating film can be made thinner so that the area of the MOS capacitor element can be reduced or the capacitance value can be increased.

Here, although the case of using the high-density plasma treatment for forming the gate insulating film has been described, the high-density plasma treatment may be used for forming not only the gate insulating film or the like but also other insulating films such as an interlayer insulating film. In addition, the high-density plasma treatment may be carried out to the semiconductor film. Accordingly, the conditions of interfaces can be improved, and thus, electrical characteristics of thin film transistors can be improved.

Next, a mask of resist is formed by photolithography, and the crystalline semiconductor layer 708 is doped with an impurity element that imparts N-type conductivity by ion doping or ion implantation to form an impurity region 709. As the impurity element that imparts N-type conductivity, an element that belongs to Group 15 may be used, and for example, phosphorus (P) or arsenic (As) is used.

The crystalline semiconductor layer 708 will later serve as a semiconductor layer of the N-type MOS capacitor element. Therefore, the concentration of the impurity element with which the crystalline semiconductor layer 708 is doped allows the threshold voltage of the N-type MOS capacitor element to be controlled. In the present invention, the dose may be controlled so that the impurity element is included at a concentration of $1 \times 10^{17}$ atoms/cm$^3$ to $1 \times 10^{20}$ atoms/cm$^3$. This set range allows the threshold voltage to have an appropriate value, and a semiconductor device according to the present invention, which is capable of preventing excessive power supply voltage from being generated, can be thus achieved. It is to be noted that a first electrode of the N-type MOS capacitor element and a region thereof where an inversion layer is formed are respectively hereinafter referred to as a gate electrode and a channel forming region in accordance with names for the thin film transistors.

Next, a first conductive layer and a second conductive layer are formed to be stacked over the gate insulating layer 705 (see FIG. 13C). The first conductive layer is formed by plasma CVD, sputtering, or the like to have a thickness of 20 to 100 nm. The second conductive layer is formed also by plasma CVD, sputtering, or the like to have a thickness of 100 to 400 nm. The first conductive layer and the second conductive layer are formed by using an element selected from tantalum (Ta), tungsten (W), titanium (Ti), molybdenum (Mo), aluminum (Al), copper (Cu), chromium (Cr), and the like; or an alloy material or a compound material containing the element as its main component, or by using a semiconductor material typified by polycrystalline silicon doped with an impurity element such as phosphorus. Examples of the combination of the first conductive layer and the second conductive layer include a combination of a layer including a tantalum nitride and a layer including tungsten, a combination of a layer including a tungsten nitride and a layer including tungsten, and a combination of a layer including a molybdenum nitride and a layer including molybdenum. Since tungsten and a tantalum nitride have high heat resistance, a heat treatment can be carried out for the purpose of thermal activation after forming the first conductive layer and the second conductive layer. In addition, in the case of a three-layer structure instead of the two-layer structure, a stack structure of a layer including molybdenum, a layer including aluminum, and a layer including molybdenum is preferably used.

Next, a mask of resist is formed by a photolithography method, and etching for forming gate electrodes and gate wirings is carried out to form conductive layers 716 to 721 to function as gate electrodes.

Next, a mask of resist is formed by a photolithography method, and the crystalline semiconductor layers 706 and 708 are doped with a low concentration of impurity element that imparts N-type conductivity by ion doping or ion implantation to form impurity regions 711 and 713 and channel forming regions 780 and 782. As the impurity element that imparts N-type conductivity, an element that belongs to Group 15 may be used, and for example, phosphorus (P) or arsenic (As) is used.

Next, a mask of resist is formed by a photolithography method, and the crystalline semiconductor layer 707 is doped with an impurity element that imparts P-type conductivity to form an impurity region 712 and a channel forming region 781. As the impurity element that imparts P-type conductivity, for example, boron (B) is used.

Next, an insulating layer is formed so as to cover the gate insulating layer 705 and the conductive layers 716 to 721. For the insulating layer, a single layer or stacked layers are formed by plasma CVD, sputtering, or the like with the use of a layer including an inorganic material such as silicon, an oxide of silicon, or a nitride of silicon, or a layer including an organic material such as organic resin. Next, the insulating layer is etched selectively by anisotropic etching mainly for the vertical direction to form insulating layers (also referred to as sidewalls) 739 to 741 in contact with the side surfaces of the conductive layers 716 to 721 (see FIG. 14A). In addition, at the same time as the formation of the insulating layers 739 to 741, the gate insulating layer 705 is etched to form insulating layers 734 to 736. The insulating layers 739 to 741 are used as masks for doping in forming LDD (Lightly Doped Drain) regions subsequently.

Next, a mask of resist is formed by a photolithography method, and the crystalline semiconductor layers 706 and 708 are doped with an impurity element that imparts N-type conductivity by using the resist mask and the insulating layers 739 to 741 as masks to form first impurity regions (also referred to as LDD regions) 727 and 729 and second impurity regions 726 and 728. The concentration of the impurity element in the first impurity regions 727 and 729 is lower than the concentration of the impurity element in the second impurity regions 726 and 728. Through the processes described above, an N-type thin film transistor 744, a P-type thin film transistor 745, and an N-type MOS capacitor element 746 are completed.

Figure 18:
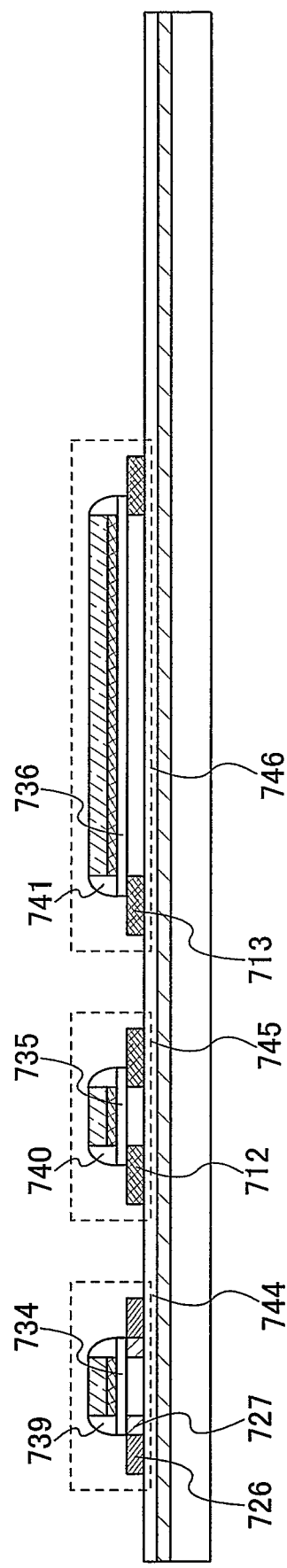
FIG. 18 is a diagram illustrating a method for manufacturing a semiconductor device according to the present invention.

The present embodiment describes the case of manufacturing an N-type MOS capacitor element. In the case of manufacturing a P-type MOS capacitor element, a P-type impurity element that is different in polarity may be used as an impurity element for the MOS capacitor element. Specifically, in the process of forming the impurity region 709 after forming the gate insulating layer 705, the crystalline semiconductor layer 708 is doped with an impurity element that imparts P-type conductivity. The dose may be controlled so that the impurity element is included at a concentration of $1 \times 10^{17}$ atoms/cm$^3$ to $1 \times 10^{20}$ atoms/cm$^3$. For forming the impurity region 713 and the channel forming region 782, doping may be carried out with an impurity element that imparts P-type conductivity at the same time as the formation of the impurity region 712 and the channel forming region 718. In addition, during forming the first impurity region 727 and the second impurity region 726, the crystalline semiconductor layer 708 is covered with a mask of resist so that the impurity regions 728 and 729 are not formed. FIG. 18 shows a drawing corresponding to FIG. 14A in the case of forming a P-type MOS capacitor element in this way.

After the N-type thin film transistor 744, the P-type thin film transistor 745, and the N-type MOS capacitor element 746 are completed, an insulating layer of a single layer or stacked layers is formed so as to cover these transistors and capacitor element (see FIG. 14B). For the insulating layer covering the thin film transistors 744 and 745 and the MOS capacitor element 746, a single layer or stacked layers are formed by an SOG method, a droplet discharging method, or the like with the use of an inorganic material such as an oxide of silicon or a nitride of silicon; an organic material such as a polyimide, a polyamide, a benzocyclobutene, an acrylic, or an epoxy resin; siloxane, or the like. Siloxane corresponds to a resin including a Si—O—Si bond. Siloxane has a skeleton structure formed by bonding of silicon (Si) and oxygen (O). An organic group containing at least hydrogen (such as an alkyl group or aromatic hydrocarbon) is used as a substituent. Alternatively, a fluoro group may be used as a substituent, or an organic group containing at least hydrogen and a fluoro group may be used as substituents.

For example, when the insulating layer covering the thin film transistors 744 and 745 and the MOS capacitor element 746 has a three-layer structure, a layer including a silicon oxide, a layer including a resin, and a layer including a silicon nitride are preferably formed as a first insulating layer 749, a second insulating layer 750, and a third insulating layer 751, respectively.

It is to be noted that a heat treatment is preferably carried out before forming the insulating layers 749 to 751 or after forming one or more of the insulating layers 749 to 751 for the purposes of recovery of the crystallinity of the semiconductor layers, activation of the impurity elements with which the semiconductor layers are doped, and hydrogenation of the semiconductor layers. To the heat treatment, thermal annealing, laser annealing, RTA, or the like is preferably applied.

Next, the insulating layers 749 to 751 are etched by a photolithography method, an etching method, or the like to form openings for exposing the second impurity regions 726 and 728 and the impurity region 712. Subsequently, a conductive layer is formed and patterned to form conductive layers 752 to 758 that function as wirings.

For the conductive layers 752 to 758, a single layer or stacked layers are formed by plasma CVD, sputtering, or the like with the use of an element selected from titanium (Ti), aluminum (Al), neodymium (Nd), and the like; or an alloy material or a compound material containing the element as its main component. The alloy material containing aluminum as its main component corresponds to, for example, a material containing aluminum as its main component and containing nickel, a material containing aluminum as its main component and containing silicon, or a material containing aluminum as its main component and containing one or more of nickel, carbon, and silicon. The conductive layers 752 to 758 preferably have, for example, a stack structure of a barrier layer, an aluminum layer containing silicon, and a barrier layer, or a stack structure of a barrier layer, an aluminum layer containing silicon, a titanium nitride layer, and a barrier layer. It is to be noted that the silicon contained in aluminum-silicon is made to be 0.1 to 5 wt %. In addition, the barrier layer corresponds to a thin film including titanium, a nitride of titanium, molybdenum, or a nitride of molybdenum. Aluminum and aluminum containing silicon have low resistance values and are inexpensive, and are thus optimal as a material for forming the conductive layers 752 to 758. When barrier layers are provided as the top and bottom layers, hillock generation can be prevented for aluminum or aluminum containing silicon. Further, when a barrier layer including titanium as an element that has a high reducing ability, a thin natural oxide film is reduced even when the natural oxide film is formed on the crystalline semiconductor layer, and thus, disconnection between the barrier layer and the crystalline semiconductor layer can be prevented.

Next, an insulating layer 762 is formed to cover the conductive layers 752 to 758 (see FIG. 15A). For the insulating layer 762, a single layer or stacked layers are formed by an SOG method, a droplet discharging method, or the like with the use of an inorganic material or an organic material. The insulating layer 762 is preferably formed to have a thickness of 0.75 to 3 μm.

Subsequently, the insulating layer 762 is etched by a photolithography method to form an opening for exposing the conductive layer 758. Subsequently, a conductive layer is formed to fill in the opening. The conductive layer is formed by plasma CVD, sputtering, or the like with the use of a conductive material. Next, the conductive layer is patterned to form a conductive layer 765. It is preferable that a single layer or stacked layers be formed for the conductive layer 765 with the use of titanium, or an alloy material or a compound material containing titanium as its main component. In addition, in the patterning process for forming the conductive layer 765, wet etching is preferably carried out in order not to damage the thin film transistors 744 and 745 and the N-type MOS capacitor element below the conductive layer 765, and a hydrogen fluoride or a mixture of ammonia and hydrogen peroxide may be used as an etching agent.

Next, an insulating layer 766 is formed to cover the conductive layer 765. For the insulating layer 766, a single layer or stacked layers are formed by an SOG method, a droplet discharging method, or the like with the use of an inorganic material or an organic material. The insulating layer 766 is preferably formed to have a thickness of 0.75 to 3 μm. Subsequently, the insulating layer 766 is etched to form an opening 769 for exposing the conductive layer 765.

Next, a conductive layer 777 that functions as an antenna is formed in contact with the conductive layer 765 (see FIG. 15B). The conductive layer 777 is formed by plasma CVD, sputtering, printing, a droplet discharging method, or the like with the use of a conductive material. For the conductive layer 777, a single layer or stacked layers are preferably formed with the use of an element selected from aluminum (Al), titanium (Ti), silver (Ag), and copper (Cu), or an alloy material or a compound material that mainly contains the element as its main component. Specifically, the conductive layer 777 is formed by screen printing with the use of a paste containing silver and then carrying out a heat treatment at 50 to 350° C. Alternatively, the conductive layer 777 may be formed by forming an aluminum layer by sputtering and then patterning the aluminum layer. For the patterning of the aluminum layer, wet etching is preferably used, and a heat treatment at 200 to 300° C. is preferably carried after the wet etching.

Next, an insulating layer 772 that functions as a protective layer is formed by an SOG method, a droplet discharging method, or the like so as to cover the conductive layer 777 that functions as an antenna. The insulating layer 772 is formed by using a layer containing carbon such as DLC (Diamond Like Carbon), a layer containing a silicon nitride, a layer containing a silicon nitride oxide, or an organic material (preferably, an epoxy resin).

Figure 16A:
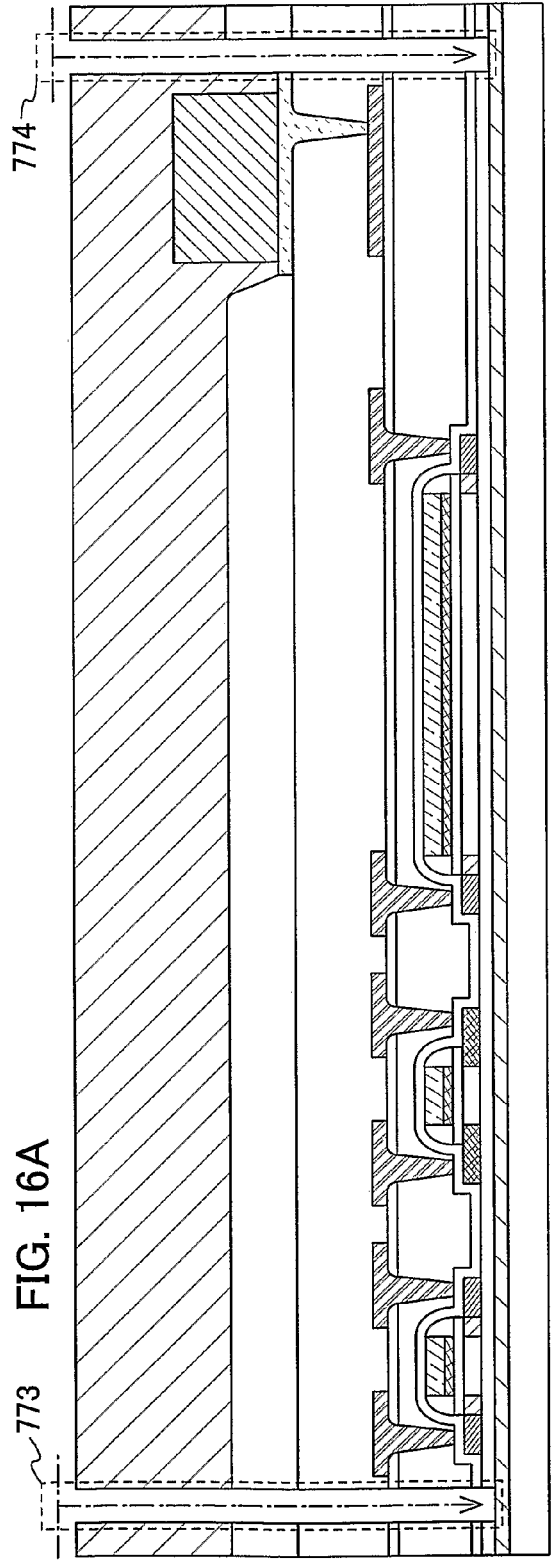
FIGS. 16A and 16B are diagrams illustrating the method for manufacturing the semiconductor device according to the present invention.

Next, the insulating layers 703, 749, 750, and 751 are etched so as to expose the separation layer 702 to form openings 773 and 774 (see FIG. 16A).

Figure 16B:
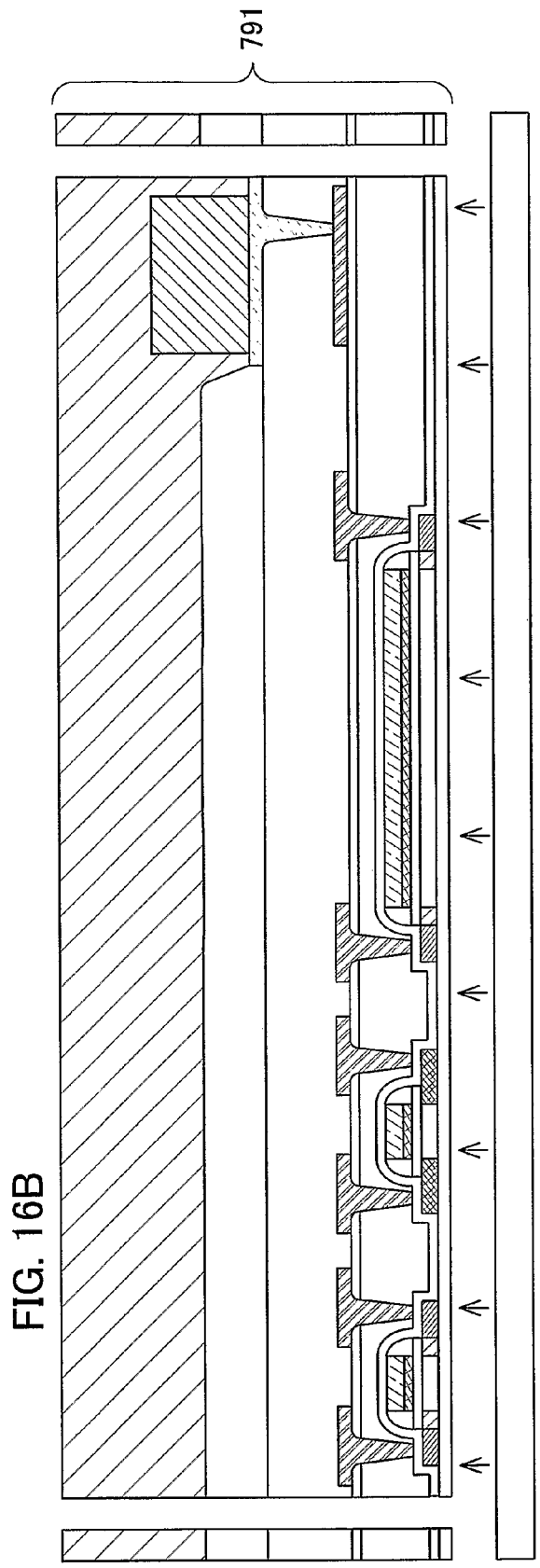

Next, an etching agent is introduced into the openings 773 and 774 to remove the separation layer 702 (see FIG. 16B). A gas or liquid containing a halogen fluoride is used as the etching agent. For example, chlorine trifluoride ($ClF_3$), nitrogen trifluoride ($NF_3$), bromine trifluoride ($BrF_3$), or hydrogen fluoride (HF) is used. It is to be noted that when hydrogen fluoride is used as the etching agent, a layer including silicon oxide is used as the separation layer 702. Through the processes described above, a thin film integrated circuit 791 including the thin film transistors 744 and 745, the N-type MOS capacitor element 746, and the conductive layer 777 that functions as an antenna is separated from the substrate 701.

The substrate 701 from which the thin film integrated circuit 791 has been separated is preferably reused for cost reduction. The insulating layer 772 is formed to prevent the thin film integrated circuit 791 from scattering after the separation layer 702 is removed. The thin film integrated circuit 791 is small, thin, and light, and thus easily scatters without being attached firmly to the substrate 701 after the separation layer 702 is removed. However, by forming the insulating layer 772 over the thin film integrated circuit 791, the thin film integrated circuit 791 increases in weight, and thus can be prevented from scattering from the substrate 701. In addition, although the thin film integrated circuit 791 itself is thin and light, the formation of the insulating layer 772 keeps the thin film integrated circuit 791 unrolled and allows a certain degree of strength to be secured.

Figure 17:
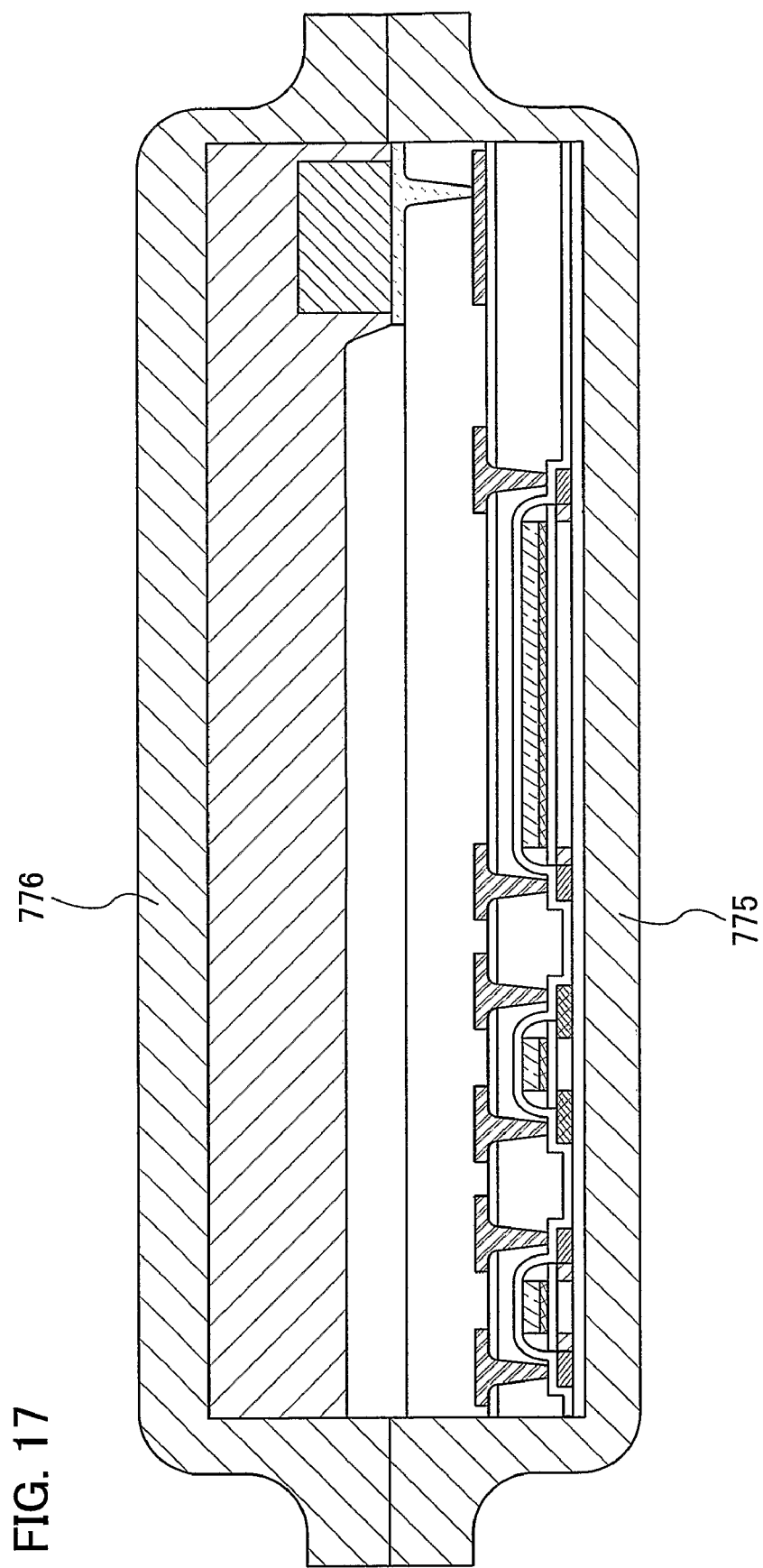
FIG. 17 is a diagram illustrating the method for manufacturing the semiconductor device according to the present invention.

Next, one surface of the thin film integrated circuit 791 is attached to a first substrate 776 to be completely separated from the substrate 701 (see FIG. 17). Subsequently, the other surface of the thin film integrated circuit 791 is attached to a second substrate 775, and sealing for the thin film integrated circuit 791 is then carried out with the first substrate 776 and the second substrate 775 by carrying out one or both of a heat treatment and a pressure treatment. Each of the first substrate 776 and the second substrate 775 corresponds to a film including a polypropylene, a polyester, a vinyl, a polyvinyl fluoride, a polyvinyl chloride, or the like, paper of a fibrous material, a stack film of a base film (a polyester, a polyamide, an inorganic vapor-deposited film, paper, or the like) and an adhesive synthetic resin film (an acrylic-based synthetic resin, an epoxy-based synthetic resin, or the like), and the like. The film is attached to an object to be processed by thermocompression bonding. In carrying out a heat treatment and a pressure treatment, an adhesive layer that is provided on the outermost surface of the film, or a layer (not an adhesive layer) that is provided on the outermost surface of the film is melted by the heat treatment and attached by applying pressure. Adhesive layers may be provided over the surfaces of the first substrate 776 and the second substrate 775, but not indispensable. The adhesive layer corresponds to a layer containing an adhesive material such as a thermosetting resin, an ultraviolet curing resin, a vinyl acetate resin-based adhesive material, a vinyl copolymer resin-based adhesive material, an epoxy resin-based adhesive material, a urethane resin-based adhesive material, a rubber-based adhesive material, or an acrylic resin-based adhesive material.

When each of the first substrate 776 and the second substrate 775 includes plastic, the device can be easily designed and processed into a flexible shape as plastic is thin and lightweight and can be bent. In addition, the device has high impact resistance, and can be easily attached to or incorporated in various articles. Accordingly, the device can be applied in various fields.

Embodiment 6

In the present embodiment, layout examples of a circuit included in a wireless chip will be described.

As described in Embodiment 5, a semiconductor layer is formed over a substrate with an insulating surface with a base film or the like interposed therebetween. Then, a pattern formed on a photomask is transferred to a resist or the like formed on the semiconductor layer by a photolithography technique to form a pattern. Etching the semiconductor layer by using the mask pattern allows an island-shaped semiconductor region that has a specific shape including a source region, a drain region, and a channel forming region of a thin film transistor to be formed.

It is often the case that the pattern on the photomask for forming semiconductor regions has rectangles. However, in the present invention, corners (convex portions) of rectangles are removed to form the pattern. Specifically, the pattern has a shape that is made rounded by removing a right triangle of 10 μm or less on a side, or has a rounded shape that is obtained by removing a region including a polygon and a curve as a portion of a right triangle region of 10 μm or less on a side.

In addition, the pattern on the photomask for forming the semiconductor regions has not only rectangles but also various shapes generally, such as the case of securing a larger region for an opening than a channel width and the case of forming thin film transistors that have different channel widths by using one semiconductor region, and has corners composed of outer sides (a convex portion) or inner sides (a concave portion). In the present invention, the corners (convex portions and concave portions) of rectangles are removed to form the pattern.

Specifically, in the case of the corner composed of a concave portion, the pattern has a shape that is made rounded by adding a right triangle of 10 μm or less on a side, or has a rounded shape that is obtained by adding a region including a polygon and a curve as a portion of a right triangle region of 10 μm or less on a side.

Figure 19:
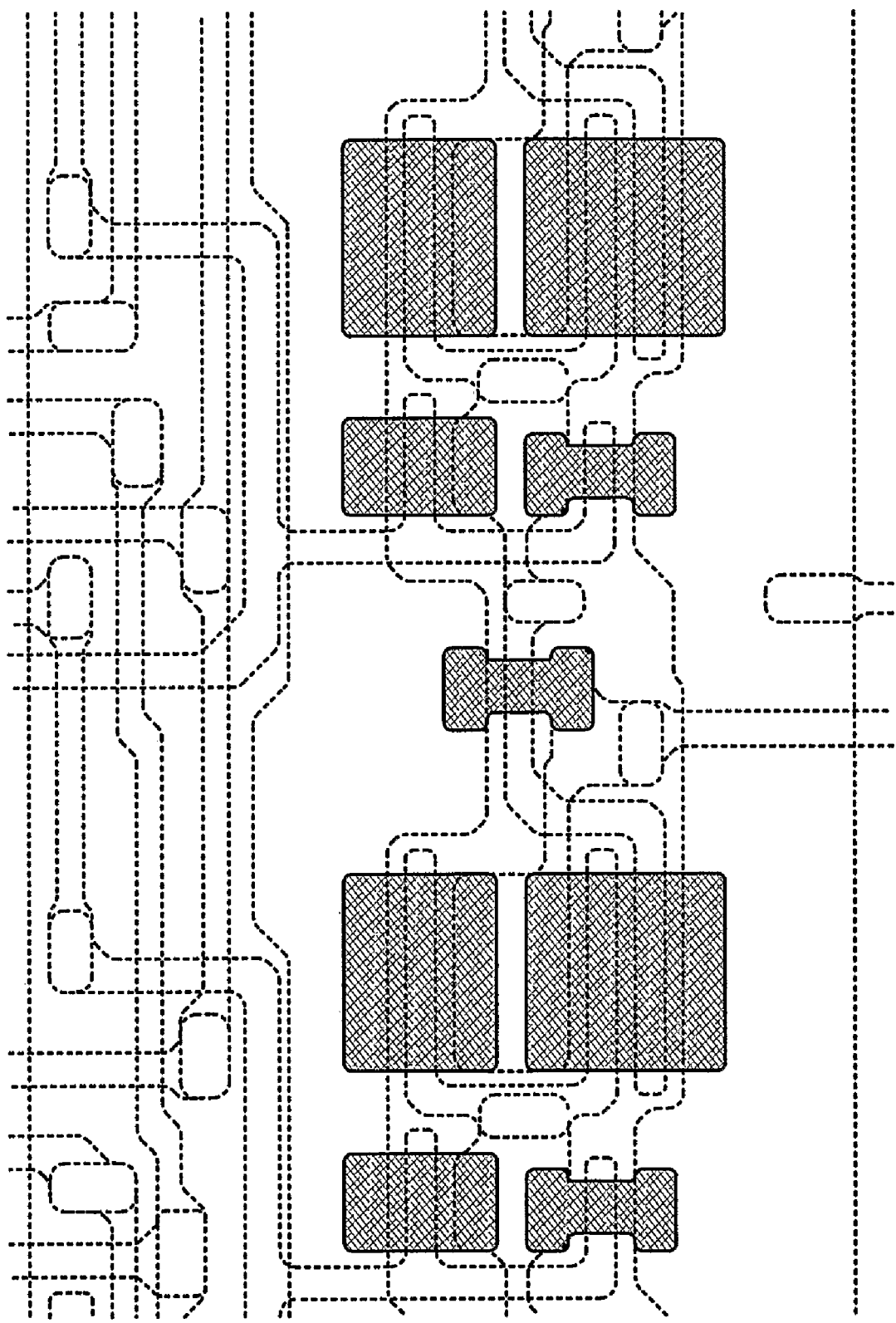
FIG. 19 is a layout diagram of a circuit included in a semiconductor device according to the present invention.

FIG. 19 shows semiconductor regions formed by transferring this mask pattern. It is to be noted that dotted lines indicate gate electrodes and wirings to be subsequently formed in FIG. 19. Further, corners of the semiconductor regions formed by transferring the mask pattern can be formed to be more rounded than the corners of the photomask pattern. In other words, the corners of the semiconductor regions may be further rounded by smoothing the shape more than the corners of the photomask pattern.

Next, a gate insulating film is formed after forming the semiconductor regions. Then, gate electrodes that are overlapped with a portion of the semiconductor regions and gate wirings are formed at the same time. The gate electrodes and the gate wirings can be formed by forming a metal layer or a semiconductor layer, transferring a pattern formed on a photomask to a resist or the like by a photolithography technique, and etching the metal layer or the semiconductor layer by using the mask pattern.

The pattern on the photomask for forming these gate electrodes or gate wirings has corners composed of a convex portion (outer sides) or a concave portion (inner sides), or bending portions composed of a convex portion (outer sides) or a concave portion (inner sides). It is to be noted that the bending portions indicate portions formed by bending of the pattern. In the present invention, the corners or the bending portions are rounded to form the pattern.

Specifically, in the case of the corner or bending portion composed of convex portions, the pattern has a shape that is made rounded by removing a right triangle of 10 μm or less on a side or a right triangle that has a size of ⅕ to ½ of the wiring width, or has a rounded shape that is obtained by removing a region including a polygon and a curve as a portion of a right triangle region of 10 μm or less on a side or a right triangle of ⅕ to ½ of the wiring width.

Alternatively, in the case of the corner or bending portion composed of concave portions, the pattern has a shape that is made rounded by adding a right triangle of 10 μm or less on a side or a right triangle that has a size of ⅕ to ½ of the wiring width, or has a rounded shape that is obtained by adding a region including a polygon and a curve as a portion of a right triangle region of 10 μm or less on a side or a right triangle of ⅕ to ½ of the wiring width.

Figure 20:
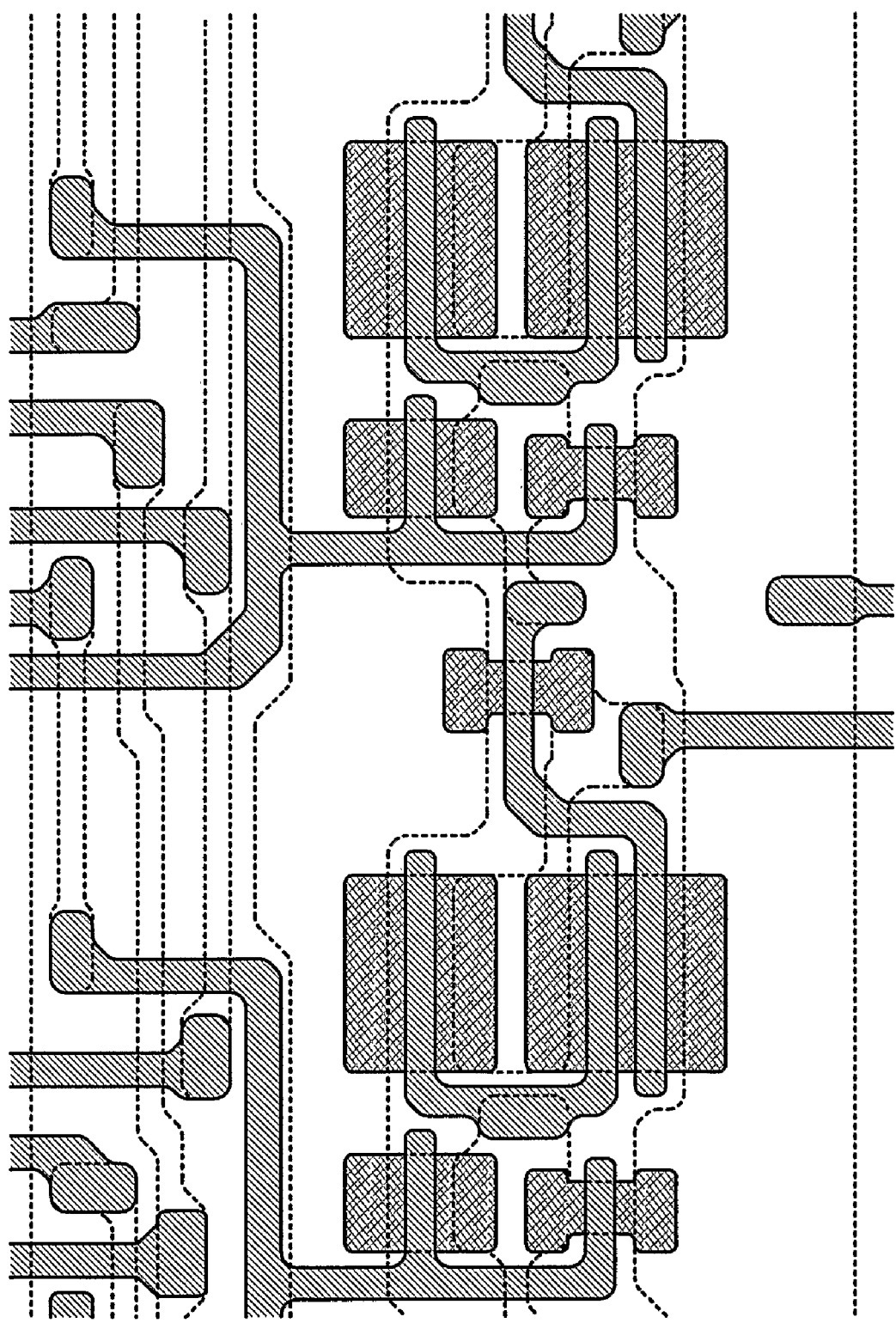
FIG. 20 is a layout diagram of the circuit included in the semiconductor device according to the present invention.

FIG. 20 shows gate electrodes and gate wirings formed by transferring this mask pattern. In FIG. 20, dotted lines indicate wirings to be subsequently formed. It is to be noted that corners of the gate electrodes and gate wirings formed by transferring the mask pattern can be formed to be more rounded than the corners of the photomask pattern. In other words, the corners of the gate electrodes and gate wirings may be further rounded by smoothing the shape than the corners of the photomask pattern.

In these gate electrodes and the gate wirings, the rounded convex portions can suppress generation of fine powder due to abnormal electrical discharge during dry etching with plasma. The convex portions of the corner portion of the gate electrodes and the gate wirings have an effect that the generation of fine powder by abnormal electrical discharge in dry etching using plasma can be suppressed. The concave portions have an effect in cleaning that even if fine powder is attached to the substrate, it is possible to wash away the fine powder without retention of cleaning solutions in the convex portion of the wiring pattern.

Next, an insulating layer or the like is formed after forming the gate electrodes and the gate wirings. Then, wirings are formed after forming openings in predetermined positions of the insulating layer. The openings are provided to electrically connecting the wiring layer to the semiconductor layer or the gate wiring layer located therebelow. The wirings can be formed by forming a metal layer, transferring a pattern formed on a photomask by a photolithography technique, and etching the metal layer by using the mask pattern.

The pattern on the photomask for forming these wirings has corners composed of a convex portion (outer sides) or a concave portion (inner sides), or bending portions composed of a convex portion (outer sides) or a concave portion (inner sides). It is to be noted that the bending portions indicate portions formed by bending of the pattern. In the present invention, the corners or the bending portions are rounded to form the pattern.

Specifically, in the case of the corner or bending portion composed of convex portions, the pattern has a shape that is made rounded by removing a right triangle of 10 μm or less on a side or a right triangle that has a size of ⅕ to ½ of the wiring width, or has a rounded shape that is obtained by removing a region including a polygon and a curve as a portion of a right triangle region of 10 μm or less on a side or a right triangle of ⅕ to ½ of the wiring width.

Alternatively, in the case of the corner or bending portion composed of concave portions, the pattern has a shape that is made rounded by adding a right triangle of 10 μm or less on a side or a right triangle that has a size of ⅕ to ½ of the wiring width, or has a rounded shape that is obtained by adding a region including a polygon and a curve as a portion of a right triangle region of 10 μm or less on a side or a right triangle of ⅕ to ½ of the wiring width.

Figure 21:
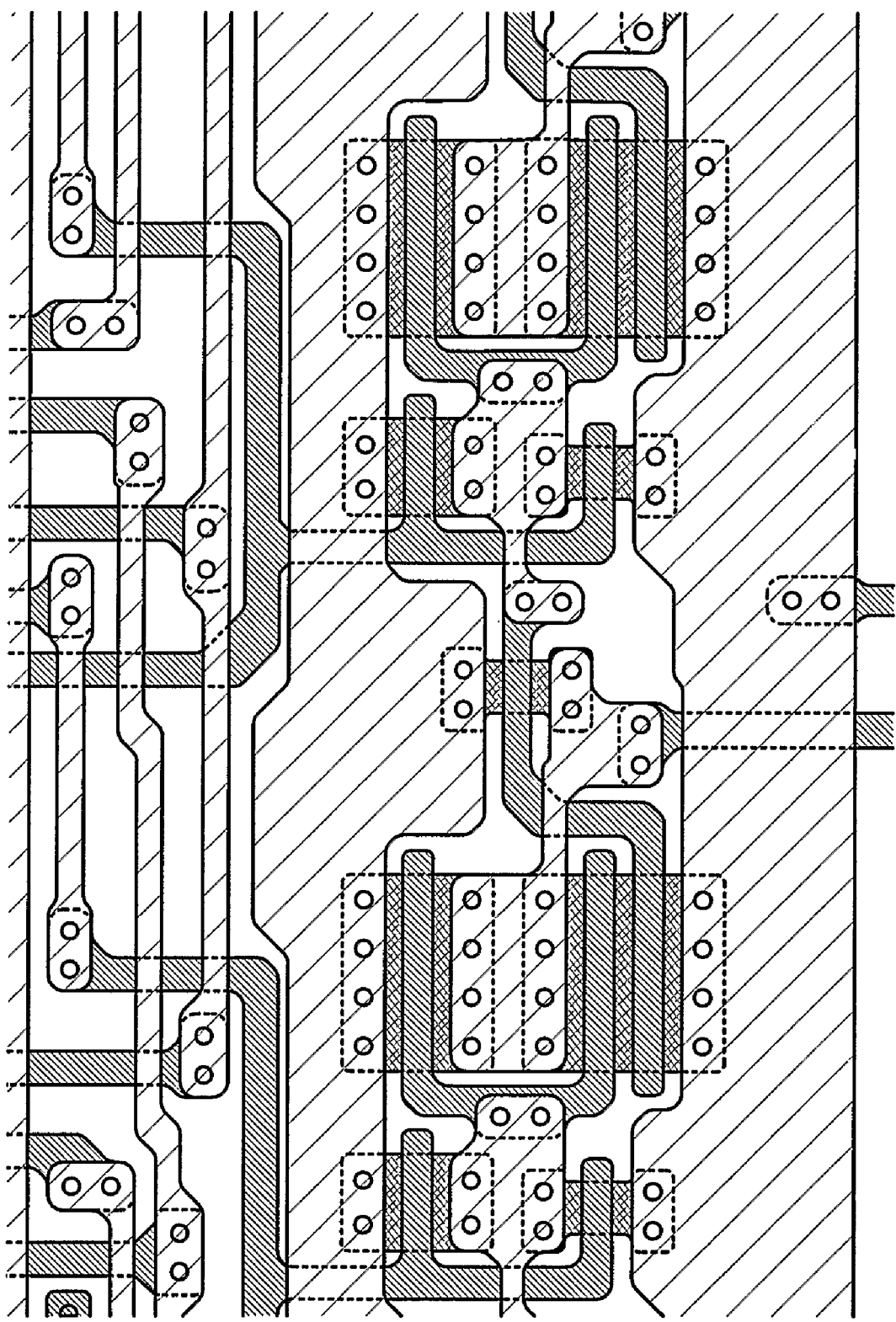
FIG. 21 is a layout diagram of the circuit of the semiconductor device according to the present invention.

FIG. 21 shows wirings formed by transferring this mask pattern. It is to be noted that corners of the wirings formed by transferring the mask pattern can be formed to be more rounded than the corners of the photomask pattern. In other words, the corners of the wirings may be further rounded by smoothing the shape than the corners of the photomask pattern.

In these gate wirings, the rounded convex portions can suppress generation of fine powder due to abnormal electrical discharge during dry etching with plasma. In addition, the rounded concave portions can sweep away generated fine powder if any that easily gathers at the corners. In particular, in wirings of a driving circuit or the like provided with a lot of parallel wirings, it is quite advantageous to allow dust to be swept away. Accordingly, the problem of dust or fine powder in a manufacturing process is solved to provide the advantage that improvement in yield can be tremendously expected. In addition, improvement of electrical conductivity can be expected particularly at high frequencies.

Although the present embodiment describes a mode of rounded corners or bending portions in the three layouts of the semiconductor layers, the gate wirings, and the wirings. However, the present invention is not to be considered limited to this mode. In other words, all or part of corners or bending portions can be made rounded in any one layer so that the problem of dust or fine powder in a manufacturing process can be solved.

Embodiment 7

Examples of an element structure and an element layout constituting the semiconductor device (see FIG. 5) described in Embodiment Mode 3 will be described.

The semiconductor device 501 according to the present invention has the resonant circuit 502 including the MOS capacitor element, the power supply circuit 503, the clock generation circuit 504, the demodulating circuit 505, the control circuit 506, the memory portion 507, and the encoding and modulating circuit 508. The resonant circuit 502 and the power supply circuit 503 are made up of analog circuits, and the control circuit 506 and the memory portion 507 are made up of digital circuits. The clock generation circuit 504, the demodulating circuit 505, and the encoding and modulating circuit 508 have analog portions and digital portions.

Figure 22:
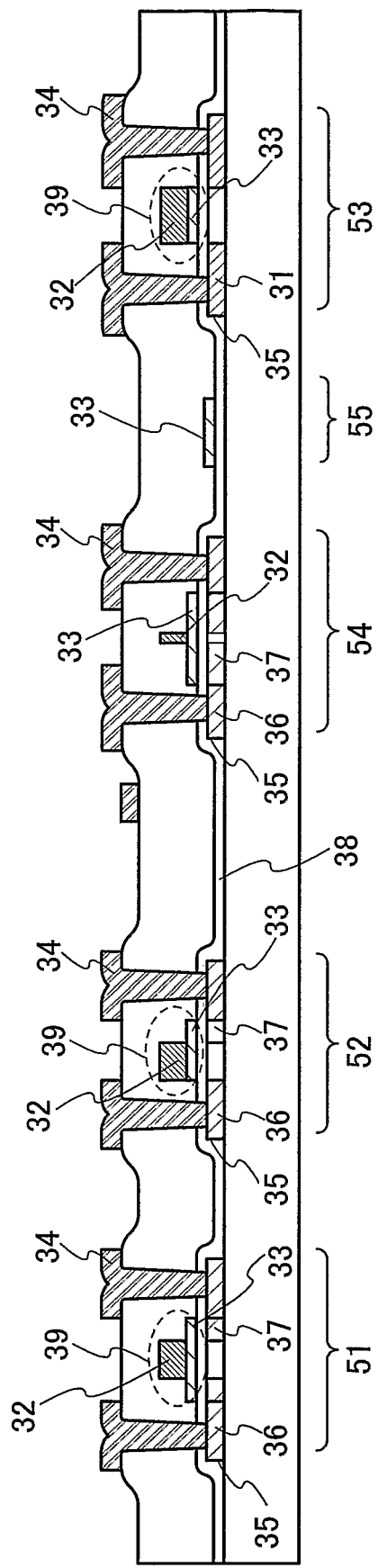
FIG. 22 is cross-sectional view of semiconductor elements included in a semiconductor device according to the present invention.

These circuits include transistors. The transistors can be made up of MOS transistors that are formed over a single-crystalline substrate, and can also be made up of thin film transistors (TFTs). FIG. 22 is a diagram showing cross-sectional structures of transistors constituting these circuits. FIG. 22 shows an N-channel transistor 51, an N-channel transistor 52, a capacitor element 54, a resistance element 55, and a P-channel transistor 53. Each transistor includes a semiconductor layer 35, an insulating layer 38, and a gate electrode 39. The gate electrode 39 is formed to have a laminated structure of a first conductive layer 33 and a second conductive layer 32. In addition, FIGS. 23A to 23E are top views respectively corresponding to the N-channel transistor 51, the N-channel transistor 52, the capacitor element 54, the resistance element 55, and the P-channel transistor 53 shown in FIG. 22, and can be seen in conjunction with FIG. 22.

In FIG. 22, the N-channel transistor 51 has impurity regions 37 formed in the semiconductor layer 35 on either side of the gate electrode in the channel length direction (the direction in which carriers flow), which are also referred to as lightly doped drains (LDDs) and are doped to have a concentration lower than the impurity concentration of impurity regions 36 forming source and drain regions in contact with wirings 34. The impurity regions 36 and 37 are doped with, in the case of arranging the N-channel transistor 51, phosphorus or the like as an impurity that imparts N-type conductivity. The LDDs are formed as a means of suppressing hot electron degradation and short channel effect.

Figure 23A:
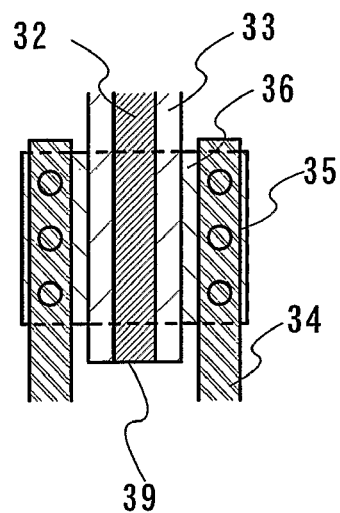
FIGS. 23A to 23E are layout diagrams of the semiconductor elements included in the semiconductor device according to the present invention.

As shown in FIG. 23A, the gate electrode 39 of the N-channel transistor 51 has the first conductive layer 33 formed to extend on either side of the second conductive layer 32. In this case, the first conductive layer 33 is formed to have a thinner film thickness than the second conductive layer. The first conductive layer 33 is formed to have a thickness that allows ion species accelerated by an electric field of 10 to 100 kV to pass. The impurity regions 37 are formed to overlap with the first conductive layer 33 of the gate electrode 39, namely, form LDD regions overlapping with the gate electrode 39. In this structure, the impurity regions 37 are formed in a self-aligned manner by doping with one conductivity-type impurity through the first conductive layer 33 of the gate electrode 39 with the second conductive layer 32 thereof used as a mask. In other words, the LDD overlapping with the gate electrode is formed in a self-aligned manner.

The transistor with the LDDs on either side is applied to a TFT for rectifying in the power supply circuit 503 in FIG. 5 and a transistor constituting a transmission gate (also referred to as an analog switch) that is used in a logic circuit. For these TFTs, it is preferable to provide LDDs on either side of a gate electrode since both positive and negative voltages are applied between source and drain electrodes.

Figure 23B:
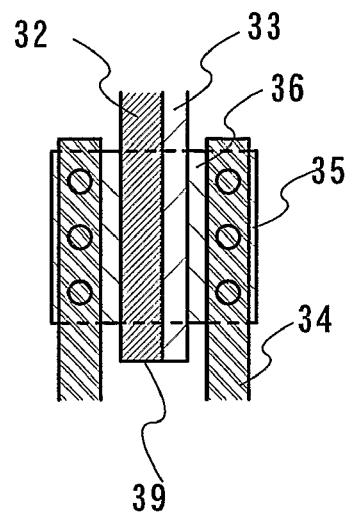

In FIG. 22, the N-channel transistor 52 has an impurity region 37 formed in the semiconductor layer 35 on one side of the gate electrode, which is doped to have a concentration lower than the impurity concentration of impurity regions 36. As shown in FIG. 23B, the gate electrode 39 of the N-channel transistor 52 has the first conductive layer 33 formed to extend on one side of the second conductive layer 32. Also in this case, the LDD can be formed in a self-aligned manner by doping with one conductivity-type impurity through the first conductive layer 33 with the second conductive layer 32 used as a mask.

The transistor with the LDD on one side may be applied to a transistor where only positive voltage or negative voltage is applied between source and drain electrodes, and specifically may be applied to a transistor constituting a logic gate such as an inverter circuit, a NAND circuit, a NOR circuit, and a latch circuit and to a transistor constituting an analog circuit such as a sense amplifier, a constant voltage generation circuit, and a VCO.

Figure 23C:
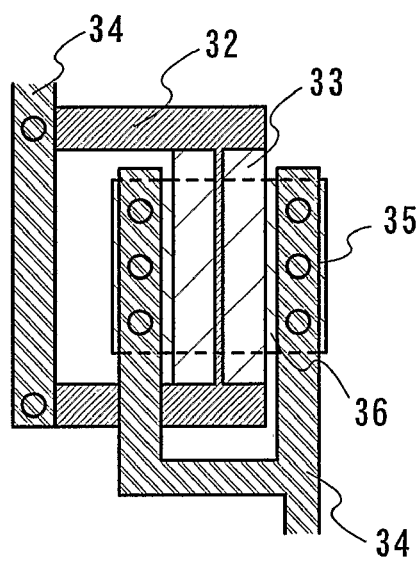
Figure 23D:
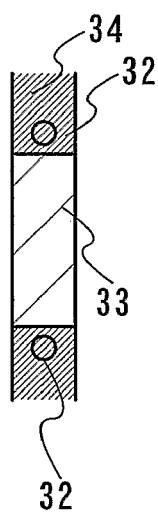
Figure 23E:
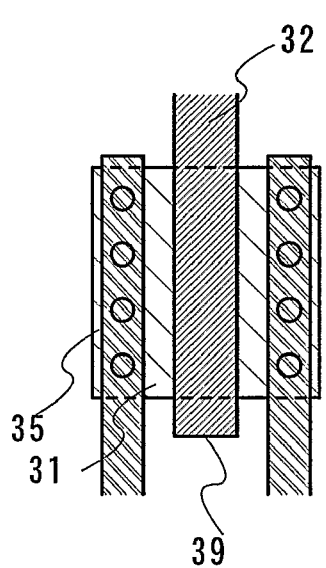
Figure 24A:
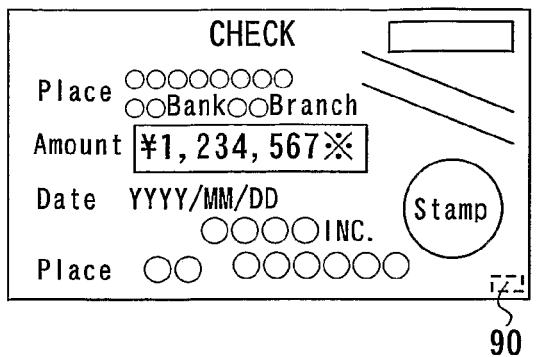
FIGS. 24A to 24G are diagrams showing electronic devices equipped with semiconductor devices according to the present invention.
Figure 24B:
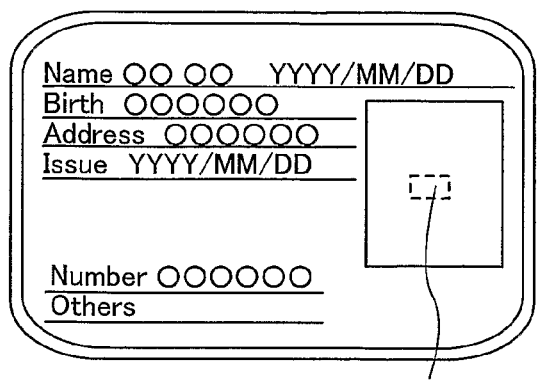
Figure 24C:
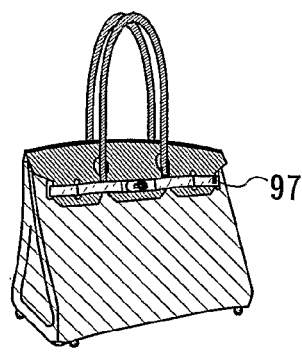
Figure 24D:
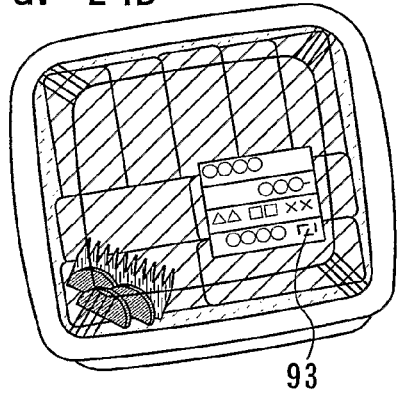
Figure 24E:
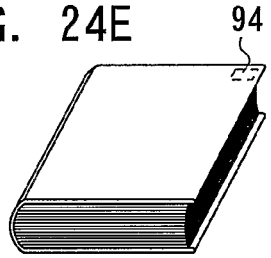
Figure 24F:
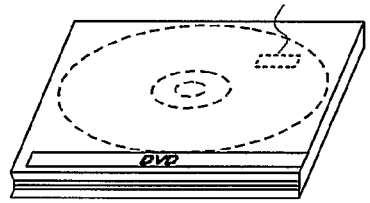
Figure 24G:
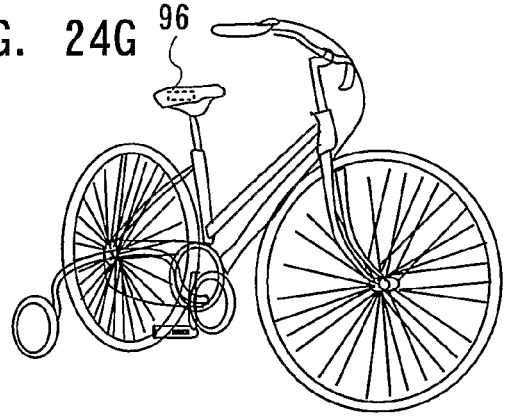

In FIG. 22, the capacitor element 54 is formed to have the insulating layer 38 sandwiched between the first conductive layer 33 and the semiconductor layer 35. The semiconductor layer 35 forming the capacitor element 54 includes impurity regions 36 and impurity regions 37. The impurity regions 37 are formed in positions overlapping with the first conductive layer 33 in the semiconductor layer 35. In addition, the impurity regions 36 are in contact with wirings 34. Since the impurity regions 37 can be doped with one conductivity-type impurity through the first conductive layer 33, the concentration of the impurity included in the impurity regions 37 can be the same as or different from the concentration of the impurity included in the impurity regions 36. In any case, since the semiconductor layer 35 is made to function as an electrode in the capacitor element 54, it is preferable that the semiconductor layer 35 be doped with one conductivity-type impurity to make the resistance lower. In addition, the first conductive layer 33 can be made to function sufficiently as an electrode by using the second conductive layer 32 as an auxiliary electrode as shown in FIG. 23C. In this way, the capacitor element 54 can be formed in a self-aligned manner by using a composite electrode structure of the first and second conductive layers 33 and 32 combined.

The capacitor element is used as a retention capacitor of the power supply circuit 503 or a resonant capacitor of the resonant circuit 502 in FIG. 5. In particular, in the case of the resonant capacitor, both positive and negative voltages are applied between the two terminals of the capacitor element, and it is thus necessary to function as a capacitor regardless of whether the voltage between the two terminals is positive or negative.

In FIG. 22, the resistance element 55 is formed with the first conductive layer 33. Since the first conductive layer 33 is formed to have a thickness of approximately 30 to 150 nm, the width and length thereof can be appropriately set to arrange the resistance element.

The resistance element is used as a resistance load of the modulating circuit 508 in FIG. 5, and may be used also as a load in the case of controlling current by a VCO or the like. The resistance element may be made up of a semiconductor layer including an impurity element at a high concentration or a metal layer that has a thin film thickness. While the resistance value of the semiconductor layer depends on the film thickness, the film quality, the impurity concentration, the activation rate, and the like, the metal layer is preferable since the resistance value of the metal layer is determined by the film thickness and the film quality and thus less variable.

In FIG. 22, the P-channel transistor 53 has the semiconductor layer 35 including impurity regions 31. These impurity regions 31 form source and drain regions in contact with wirings 34. The gate electrode 39 has a structure of the first and second conductive layers 33 and 32 overlapped with each other. The P-channel transistor 53 is a transistor that has a single drain structure without an LDD. In the case of forming the P-channel transistor 53, the impurity regions 31 are doped with boron or the like as an impurity that imparts P-type conductivity. In contrast, when the impurity regions 31 are doped with phosphorus, an N-channel transistor that has a single drain structure can be formed.

One or both of the semiconductor layer 35 and the insulating layer 38 may be subjected to an oxidation or nitridation treatment by a microwave-excited high-density plasma treatment that has an electron temperature of 2 eV or less, ion energy of 5 eV or less, and an electron density on the order of $10^{11}$ to $10^{13}$/cm$^3$ as previously described. In this case, the defect level at the interface between the semiconductor layer 35 and the insulating layer 38 can be reduced by carrying out the treatment at a substrate temperature of 300 to 450° C. in an oxidizing atmosphere ($O_2$, $N_2O$, or the like) or a nitriding atmosphere ($N_2$, $NH_3$, or the like). By carrying out this treatment for the insulating layer 38, this insulating layer can be made dense. In other words, generation of a charged defect can be prevented to prevent fluctuation in the threshold voltage of the transistor. In addition, in the case of driving the transistor at a voltage of 3 V or less, an insulating layer oxidized or nitrided by this plasma treatment can be applied as the insulating layer 38. Alternatively, in the case where the driving voltage of the transistor is 3 V or more, an insulating layer formed by this treatment on the surface of the semiconductor layer 35 and an insulating layer deposited by CVD (plasma CVD or thermal CVD) can be combined to form the insulating layer 38. Also, this insulating layer can be used as the dielectric layer of the capacitor element 54. In this case, a capacitor element with a large charge capacity can be formed since this insulating layer formed by this plasma treatment has a thickness of 1 to 10 nm and is a dense film.

As described with reference to FIG. 22 and FIG. 23A to 23E, elements that have various structures can be formed by combining conductive layers that are different in film thickness. A region where only the first conductive layer is formed and a region where the first conductive layer and the second conductive layer are stacked can be formed by using a photomask or a reticle provided with an assist pattern that is composed of a diffraction grating pattern or a semi-transparent film and has a function of reducing a light intensity, In other words, when a photoresist is exposed to light in a photolithography process, the amount of light transmitted through the photomask is controlled to provide different thicknesses for a developed resist mask. In this case, the photomask or reticle provided with slits of the resolution limit or less may be used to form a resist that has the complicated shape described above. In addition, baking at about 200° C. may be carried out after the development to change the shape of the mask pattern formed from a photoresist material.

In addition, a region where only the first conductive layer is formed and a region where the first conductive layer and the second conductive layer are stacked can be formed continuously by using a photomask or a reticle provided with an assist pattern that is composed of a diffraction grating pattern or a semi-transparent film and has a function of reducing a light intensity. As shown in FIG. 23A, the region where only the first conductive layer is formed can be formed selectively over the semiconductor layer. This region is effective over the semiconductor layer, but not necessary in a region (a wiring region continued from the gate electrode) other than that. Since the use of this photomask or reticle need not form the region where only the first conductive layer is formed, in the wiring region, the wiring density can be substantially increased.

In the case of FIG. 22 and FIG. 23A to 23E, the first conductive layer is formed to have a thickness of 30 to 50 nm by using a high melting point metal such as tungsten (W), chromium (Cr), tantalum (Ta), tantalum nitride (TaN), or molybdenum (Mo), or an alloy or compound including the high melting point metal as its main component. In addition, the second conductive layer is formed to have a thickness of 300 to 600 nm by using a high melting point metal such as tungsten (W), chromium (Cr), tantalum (Ta), tantalum nitride (TaN), or molybdenum (Mo), or an alloy or compound including the high melting point metal as its main component. For example, different conductive materials are used for the respective first and second conductive layers to result in a difference in etching rate in an etching process to be carried our subsequently. As an example, TaN can be used for the first conductive layer, and a tungsten film can be used as the second conductive layer.

The present embodiment shows that transistors that have different electrode structures, a capacitor element, and a resistance element can be formed all together in the same patterning process by using a photomask or a reticle provided with an assist pattern that is composed of a diffraction grating pattern or a semi-transparent film and has a function of reducing a light intensity. This allows elements in different modes to be formed and integrated depending on circuit characteristics without increasing the number of processes.

Embodiment 8

Applications of the wireless chip according to the present invention will be described with reference to FIGS. 24A to 24G. The application range of the wireless chip according to the present invention is wide, and for example, can be provided and used for bills, coins, securities, certificates, bearer bonds, containers for wrapping, books, storage mediums, personal belongings, vehicles, food, garments, health products, daily commodities, medicine, electronic devices, and the like.

The bills and coins are money that circulates in the market, and includes one that can be used in the same way as money in a specific area (cash voucher), a commemorative coin, and the like. The securities indicate a check, a certificate, a promissory note, and the like, to which a wireless chip 90 can be provided (see FIG. 24A). The certificates indicate a driver's license, a resident's card, and the like, to which a wireless chip 91 can be provided (see FIG. 24B). The vehicles indicate a wheeled vehicle such as a bicycle, a marine vessel, and the like, to which a wireless chip 97 can be provided (see FIG. 24G). The bearer bonds indicate a stamp, a food coupon, various gift coupons, and the like. The containers for wrapping indicate a wrapper for a packed lunch, a plastic bottle, and the like, to which a wireless chip 93 can be provided (see FIG. 24D). The books indicates a volume, a book, and the like, to which a wireless chip 94 can be provided (see FIG. 24E). The storage mediums indicate DVD software, a video tape, and the like, to which a wireless chip 95 can be provided (see FIG. 24F). The personal belongings indicate to a bag, glasses, and the like, to which a wireless chip 96 can be provided (see FIG. 24C). The food indicates foods, beverages, and the like. The garments indicate clothes, shoes, and the like. The health products indicate a medical apparatus, a health appliance, and the like. The daily commodities indicate furniture, lighting apparatus, and the like. The medicine indicates a drug, an agricultural chemical, and the like. The electronic devices indicate a liquid crystal display device, an EL display device, television sets (a television receiver and a thin television receiver), a cellular phone, and the like.

A wireless chip according to the present invention is fixed to an article by being mounted on a printed board, being attached to the surface of the article, or being implanted in the article. For example, the wireless chip is fixed to an article by being implanted in paper in the case of a book, or by being implanted in an organic resin in the case of a package composed of the organic resin. The wireless chip according to the present invention achieves smallness, thinness, and lightness, and thus, does not damage the design of the article itself. In addition, by providing semiconductor devices according to the present invention for bills, coins, securities, bearer bonds, certificates, and the like, an authentication function can be provided, and falsification can be prevented by utilizing this authentication function. In addition, by providing wireless chips according to the present invention for containers for wrapping, storage mediums, personal belongings, food, garments, daily commodities, electronic devices, and the like, systems such as an inspection system can be facilitated.

In particular, the wireless chip according to the present invention prevents voltage that is generated inside from excessively increasing also in a strong magnetic field and has high reliability, a small chip area, and low power consumption without adding extra circuits such as a limiter circuit and a constant voltage generation circuit, and is thus effective in various applications as described above, particularly in an application where a plurality of chips needs to be read. In addition, the wireless chip formed over a flexible base is effective in an application that is assumed to be bent during use, such as paper.

Embodiment 9

A layout example of a memory cell of a static RAM (SRAM) as one of elements constituting a semiconductor device according to the present invention will be described with reference to FIGS. 25A to 27B.

Figure 25A:
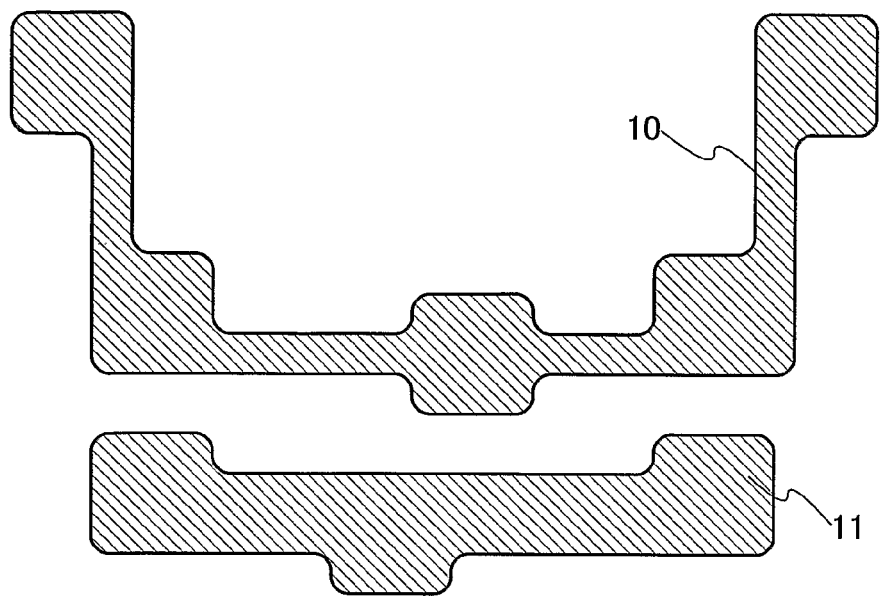
FIGS. 25A and 25B are layout diagrams of a circuit included in a semiconductor device according to the present invention.

It is preferable that semiconductor layers 10 and 11 shown in FIG. 25A be formed by using silicon or a crystalline semiconductor containing silicon as its main component. For example, polycrystalline silicon, single-crystalline silicon, or the like obtained by crystallizing a silicon film by laser annealing or the like is applied. Besides, a metal oxide semiconductor, amorphous silicon, or an organic semiconductor that shows semiconductor characteristics can be applied.

In any case, a semiconductor layer that is formed first is formed over the entire surface or a portion (a region that has a larger area than a region that is defined as a semiconductor region of a transistor) of a substrate with an insulating surface. Then, a mask pattern is formed over the semiconductor layer by a photolithography technique. The semiconductor layer is etched by using the mask pattern to form the island-shaped semiconductor layers 10 and 11 that have specific shapes including source and drain regions and channel forming regions of the TFTs. The semiconductor layers 10 and 11 are defined in consideration of the adequacy of layout thereof.

Figure 25B:
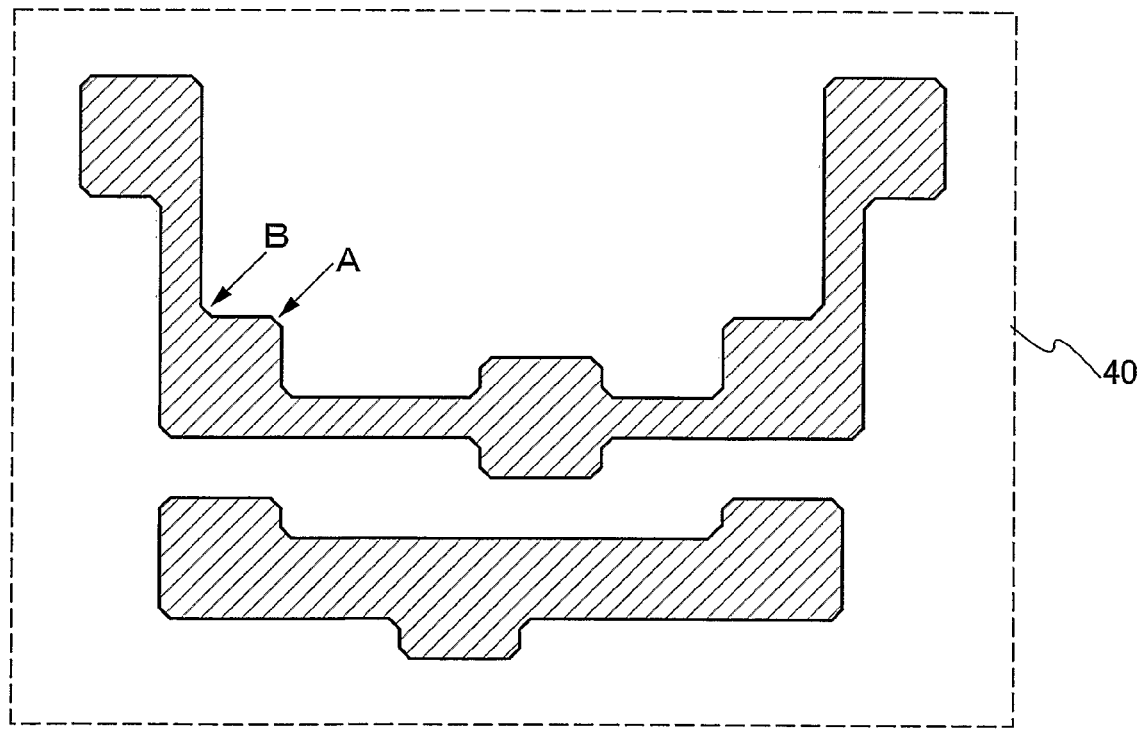

The photomask for forming the semiconductor layers 10 and 11 shown in FIG. 25A has a mask pattern 40 shown in FIG. 25B. The mask pattern 40 depends on whether the resist that is used in the photolithography process is a positive type or a negative type. When a positive type resist is used, the mask pattern 40 shown in FIG. 25B is made as a light-shielding portion. The mask pattern 40 has a polygon shape with a vertex portion A removed. An inside of a corner B has a shape in which its corner portion is bent in multiple degrees so as not to be a right angle. In this pattern of the photomask, an angular portion of the corner portion is removed.

The shape of the mask pattern 40 shown in FIG. 25B is reflected in the semiconductor layers 10 and 11 shown in FIG. 25A. In that case, a shape that is similar to the mask pattern 40 may be transferred. Alternatively, a shape may be transferred so that the corners of the mask pattern 40 are further rounded. In other words, the pattern shape of the mask pattern 40 may be more smoothed to provide rounded portions.

Figure 26A:
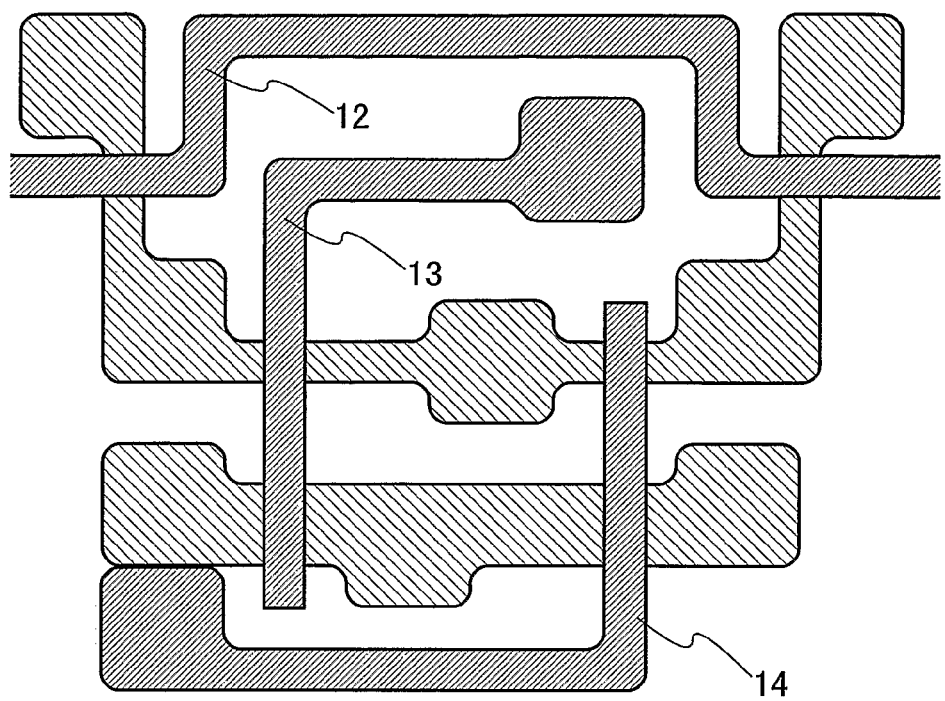
FIGS. 26A and 26B are layout diagrams of the circuit included in the semiconductor device according to the present invention.

An insulating layer at least partially including silicon oxide or silicon nitride is formed over the semiconductor layers 10 and 11. One of purposes of forming the insulating layer is using as a gate insulating layer. Then, as shown in FIG. 26A, gate wirings 12, 13, and 14 are formed to overlap with the semiconductor layers partially. The gate wiring 12 is formed to correspond to the semiconductor layer 10, while the gate wiring 13 is formed to correspond to the semiconductor layers 10 and 11. Further, the gate wiring 14 is formed to correspond to the semiconductor layers 10 and 11. A metal layer or a highly conductive semiconductor layer is formed over the insulating layer, and the shapes of the gate wirings are formed by a photolithography technique.

Figure 26B:
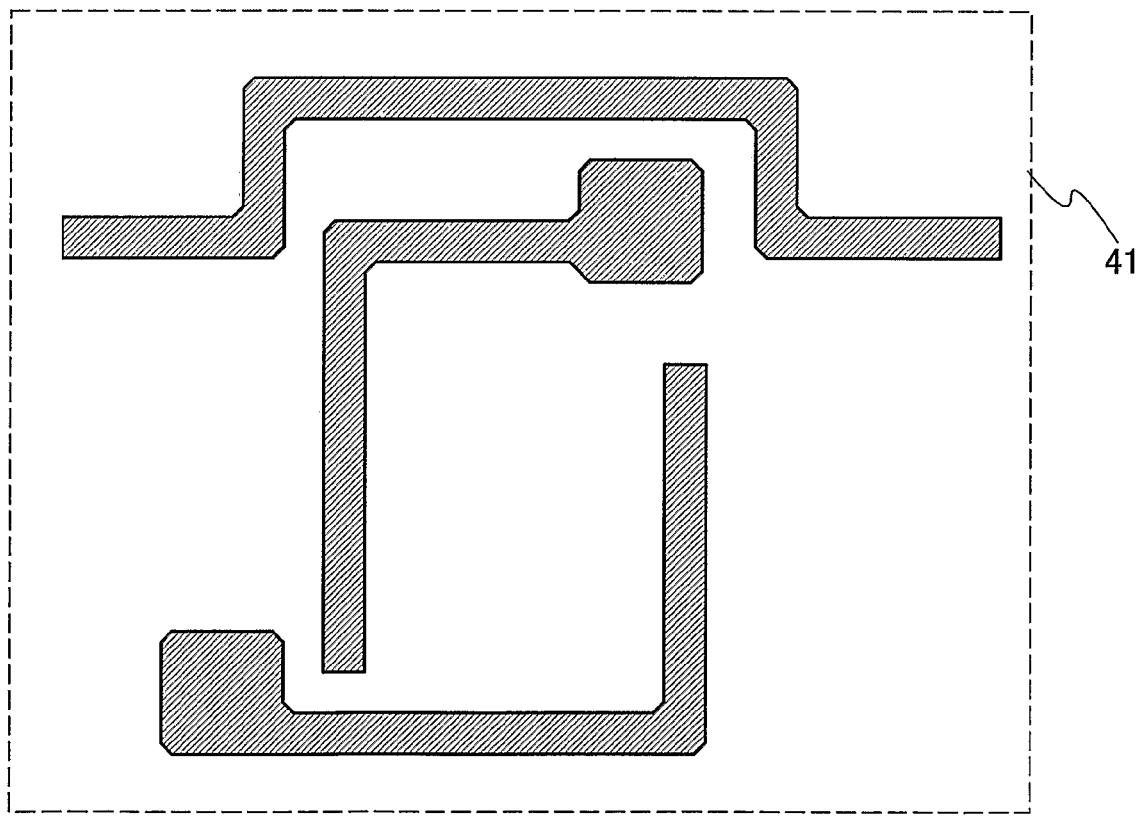

The photomask for forming the gate wirings has a mask pattern 41 shown in FIG. 26B. In this mask pattern 41, an angular portion of a corner portion of the mask pattern is removed by a length of a half or less and a fifth or more of the line width of the wiring. The shape of the mask pattern 41 shown in FIG. 26B is reflected in the gate wirings 12, 13, and 14 shown in FIG. 26A. In that case, although the shape similar to the mask pattern 41 may be transferred, the transfer may be conducted so that the corner portion of the mask pattern 41 is further rounded. In other words, a round portion in which the pattern shape is smoothed more than the mask pattern 41 may be provided in the gate wirings 12, 13 and 14. Outside of the corner portion of the gate wirings 12, 13 and 14 has an effect that the generation of fine powder by abnormal electrical discharge in dry etching using plasma can be suppressed. Inside of the corner portion has an effect in cleaning that even if fine powder is attached to the substrate, it is possible to wash away the fine powder without retention of cleaning solutions in the corner portion of the wiring pattern.

An interlayer insulating layer is a layer that is formed after the gate wirings 12, 13, and 14. The interlayer insulating layer is formed by using an inorganic insulating material such as a silicon oxide or an organic insulating material using a polyimide, an acrylic resin, or the like. An insulating layer of a silicon nitride, a silicon nitride oxide, or the like may be made to lie between the interlayer insulating layer and the gate wirings 12, 13, and 14. In addition, an insulating layer of a silicon nitride, a silicon nitride oxide, or the like may be formed also over the interlayer insulating layer. The insulating layers can prevent contamination of the semiconductor layer and the gate insulating layer due to impurities such as exogenous metal ions and moisture, which are harmful to TFTs.

Figure 27A:
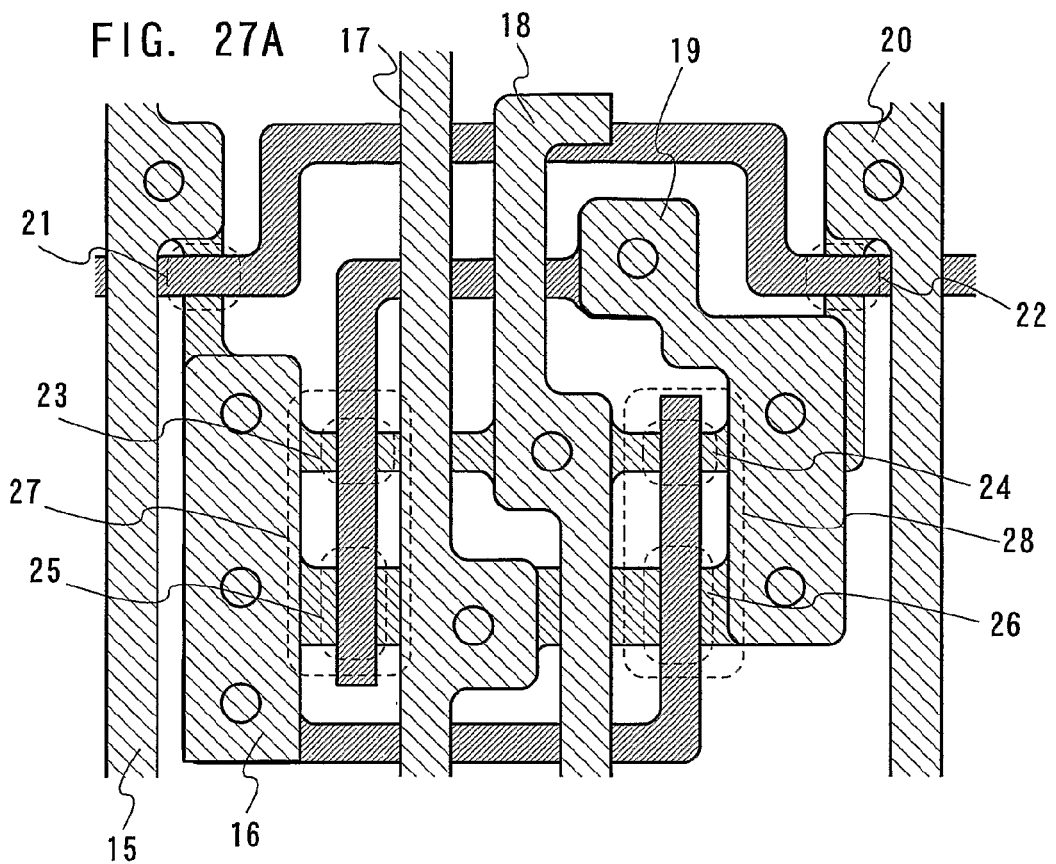
FIGS. 27A and 27B are layout diagrams of the circuit included in the semiconductor device according to the present invention.

The interlayer insulating layer has openings formed in predetermined positions. For example, the openings are provided to correspond to the gate wirings and the semiconductor layers therebelow. A wiring layer that is formed by using one or more layers of metals or metal compounds is formed in such a way that a mask pattern is formed by a photolithography technique to form a predetermined pattern by etching. Then, as shown in FIG. 27A, wirings 15 to 20 are formed to overlap with the semiconductor layers partially. The wirings couple specific elements. The wirings do not connect specific elements linearly, but include bending portions due to restriction of the layout. In addition, the wiring widths vary in contact portions and another region. In the case where the contact hole is equal to or larger than the wiring width in the contact portion, the wiring width varies to be wider in the portion.

Figure 27B:
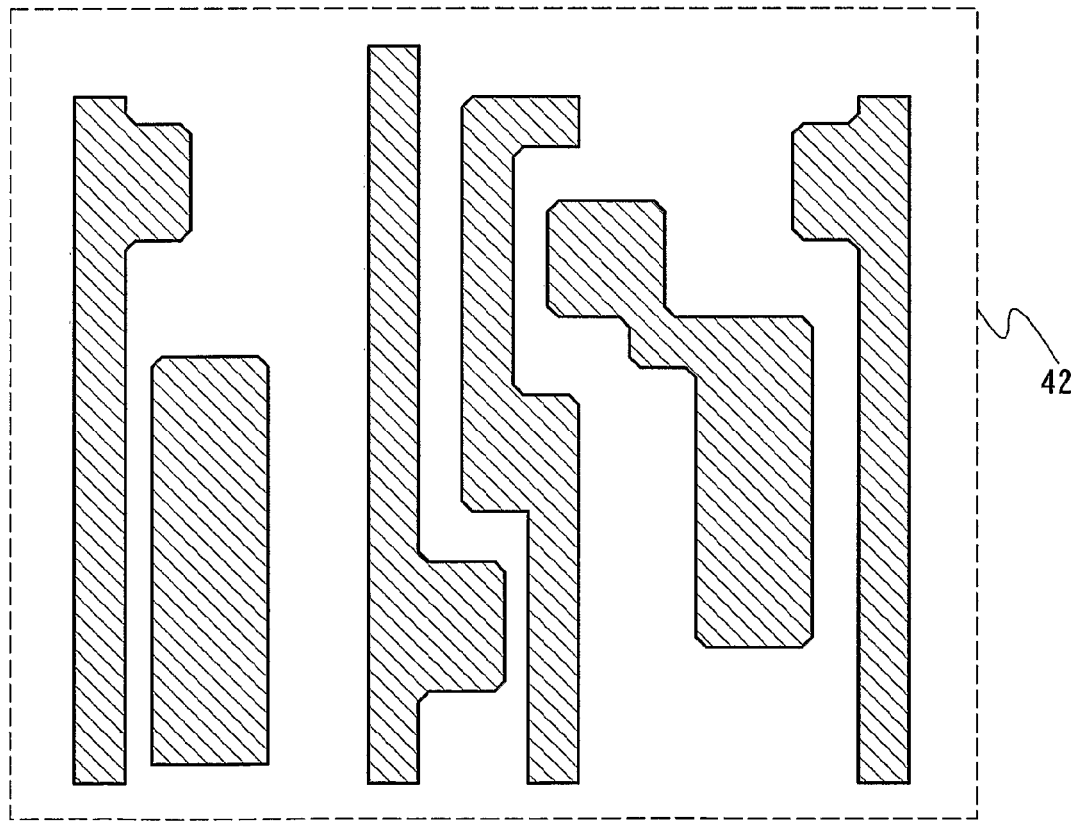

The photomask for forming these wirings 15 to 20 has a mask pattern 42 shown in FIG. 27B. Also in this case, in a corner portion of the wiring, which is bent into an L-shape, respectively, an angular portion of the corner portion is removed so that a side length of a right triangle is 10 µm or less, or a half or less and a fifth or more of the line width of the wiring. Accordingly, the corner portion of the wiring is made to have a rounded pattern. In other words, outer periphery of a wiring layer in the corner portion viewed from above is made to form a curved line. Specifically, part of the wiring layer corresponding to an isosceles right triangle, which is formed with two first straight lines interposing the corner portion and being perpendicular to each other and a second straight line at approximately 45 degrees to these two first straight lines, is removed so that an outer peripheral edge of the corner portion is made to be rounded. When the removal is finished, two obtuse angle portions are newly formed in the wiring layer. The wiring layer is preferably etched so that a curved line, which is in contact with both of the first straight line and the second straight line, is formed in each obtuse angle portion by appropriately conducting a mask design and setting an etching condition. It is to be noted that length of two sides of the isosceles right triangle, which are equal to each other, is made to be ⅕ or more and ½ or less of the width of the wiring. An inner periphery of the corner portion is also formed to be rounded along the outer periphery of the corner portion. In such a shape of a wiring, the generation of fine powder by abnormal electrical discharge in dry etching using plasma can be suppressed. In cleaning of the substrate, even if fine powder is attached to the substrate, it is possible to wash away the fine powder without retention of cleaning solutions in the corner portion of the wiring pattern. As a result, there is an effect that yield can be improved. This is also advantageous in that when many parallel wirings are provided over the substrate, fine powder attached to the substrate can be easily washed away. In addition, the corner portion of the wiring is rounded, and accordingly, electric conduction can be expected.

In FIG. 27A, N-channel transistors 21 to 24 and P-channel transistors 25 and 26 are formed, which constitute a memory cell circuit composed of the six transistors for an SRAM. The wirings 17 and 18 are wirings that have VDD and GND potentials, the gate wiring 12 is a word line, and the wirings 15 and 20 are bit lines. The N-channel transistor 23 and the P-channel transistor 25 constitute an inverter while the N-channel transistor 24 and the P-channel transistor 26 constitute an inverter, and the inverters together constitute a flip-flop circuit.

The circuit shown in FIGS. 25A to 27B can be manufactured in accordance with the same process as in Embodiment 5.

The present embodiment can be practiced in combination with Embodiment 7. For example, the circuit in the present embodiment can be formed in such a way that a photomask or a reticle provided with an assist pattern that is composed of a diffraction grating pattern or a semi-transparent film and has a function of reducing a light intensity is used to include a transistor that has a lightly doped drain (LDD) on one or both sides of a gate electrode.

Embodiment 10

In the present embodiment, a model of making appropriate decisions on timing of repair by arranging a plurality of wireless chips for a building to continuously obtain the condition of the building being stressed will be described as an application example using a wireless chip according to the present invention.

Each of the wireless chips placed for the building has a memory and a sensor. The wireless chip is allowed to carry out writing in and reading from the memory and operate the sensor by receiving instructions (command), and store information from the sensor. The stored information can be transmitted to a manager through wireless communication.

As this sensor, sensors needed to grasp the condition of the building, such as a temperature sensor, a pressure sensor, and a humidity sensor, can be cited. The building expands and shrinks repeatedly due to change in temperature, and is made decrepit due to the effects of these expansion and shrinkage. Therefore, the temperature information can be said to be important information for grasping the building being made decrepit. Also, humidity and pressure can be considered factors affecting the building being made decrepit. The factors affecting the building being made decrepit is referred to as stress. In addition, the information obtained by measuring the stress over a period of time is referred to as information on the stress with time.

Figure 30A:
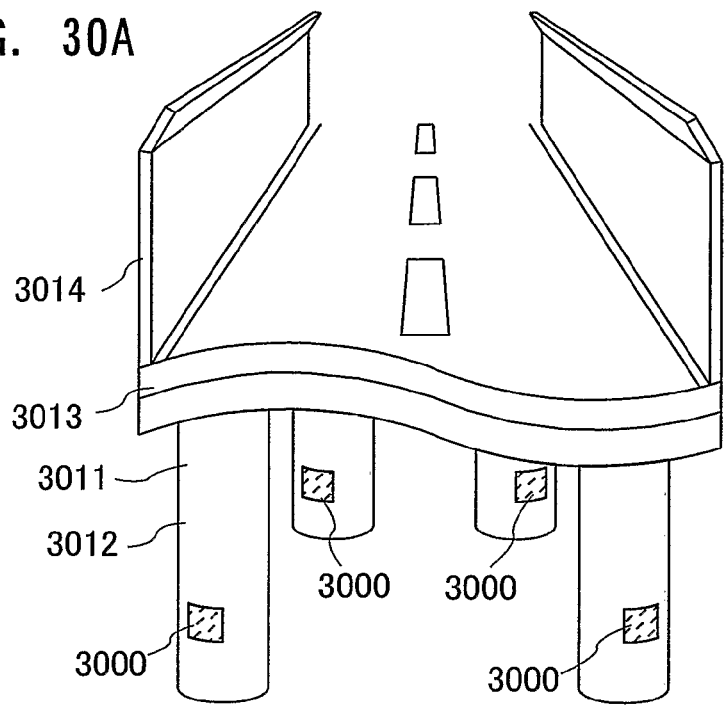
FIGS. 30A and 30B are examples to which semiconductor devices according to the present invention are applied.

FIG. 30A shows an elevated bridge with a road. A wireless chip 3000 with a temperature sensor can be placed for a skeleton section, pillars 3011, concrete 3012, asphalt 3013, and the like of the elevated bridge. In the case of providing a plurality of wireless chips 3000, the wireless chips 3000 may be irregularly arranged or regularly arranged for the elevated bridge. The placement of a wireless chip for the elevated bridge includes a mode of attaching the wireless chip to a wall 3014 of the elevated bridge or the surface of a pillar 3011 and a mode of implanting the wireless chip into asphalt 3013, concrete 3012, or the like constituting the road. In the case of applying the wireless chip 3000 with the temperature sensor in the present embodiment or a wireless chip with a humidity sensor, the wireless chip may be attached to the surface of the road or implanted into a member constituting the building. It is to be noted that the implant mode is preferable in the case of applying a wireless chip with a pressure sensor.

The serial number of a wireless chip and position information of the road may correspond to the wireless chip 3000, and are stored in a memory included in the wireless chip 3000. Further, information such as the date of built, the building components, the use of the building, the builder, the owner, and environmental information is stored in the memory of the wireless chip as initial information. This initial information is not required to be deleted, and thus preferably stored in a write once memory.

Further, a base station covering a specific range of road as a radio wave transmittable region and a base station antenna are provided around the road.

When the wireless chip 3000 receives radio waves from the base station through an antenna, the wireless chip 3000 is allowed to demodulate instructions from the received radio waves and carry out predetermined processing in accordance with the instructions. The predetermined processing is, for example, processing based on a set of instructions; an instruction 1, an instruction 2, and an instruction 3. When the instruction 1 is received, temperature information is obtained from the temperature sensor and stored in a non-volatile memory included in the memory in the chip. When the instruction 2 is received, the temperature information stored in the memory is transmitted. When the instruction 3 is received, the information stored in the memory is deleted. It is to be noted that the instruction 3 is effective only when the memory has a rewritable non-volatile memory. Rewritable non-volatile memories include an EEPROM (Electrically Erasable Programmable Read-Only Memory) and the like.

Figure 29:
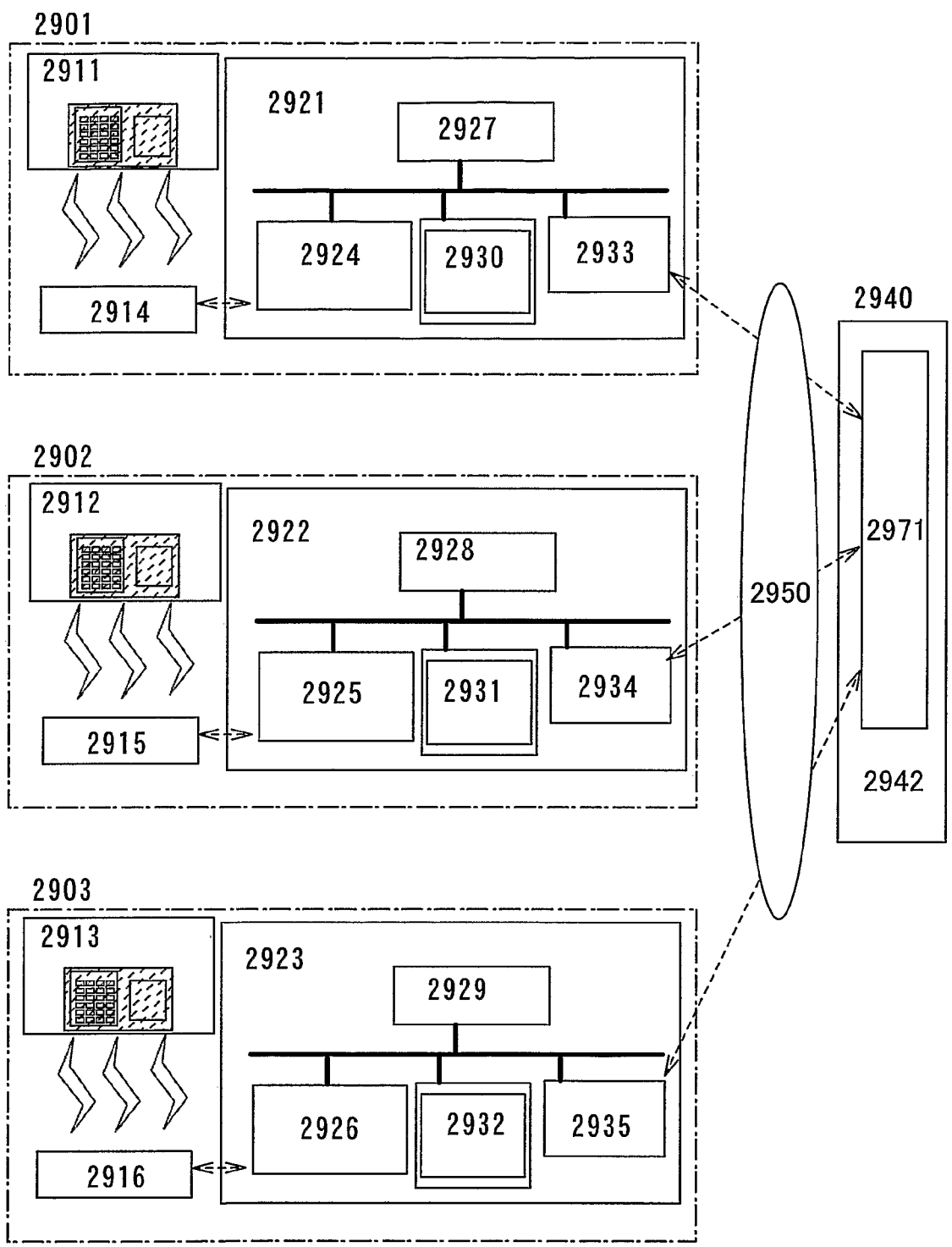
FIG. 29 is a system configuration example to which a semiconductor device according to the present invention is applied.

In addition, FIG. 29 shows a mode as an example of the system of the present embodiment, where information processing devices 2921, 2922, and 2923 are set up for a region A 2901 including a building A 2911, a region B 2902 including a building B 2912, and a region C 2903 including a building C 2913 respectively, that cover specific ranges to transmit information with time and the like by a communication network 2950 through a transmitting/receiving unit of the information processing device to an information processing device 2942 of a manager 2940. In this case, the information processing device 2942 of the manager 2940 has a transmitting/receiving unit 2941 for information transmission to and from information processing devices 2921, 2922, and 2923. As the communication network 2950, the Internet system can be used, and in addition, a telephone line, a public line such as cellular phones, and a LAN (Local Area Network) can be cited. A communication means using the communication network 2950 includes e-mail. The information processing devices 2921, 2922, and 2923 have at least interface units 2923, 2924, and 2925 for reader/writers 2914, 2915, and 2916, arithmetic processing units 2926, 2927, and 2928, databases 2929, 2930, and 2931, and transmitting/receiving units 2932, 2933, and 2934, respectively. Information obtained through the interface units 2923, 2924, and 2925 is processed by the arithmetic processing units 2926, 2927, and 2928 if necessary, and then stored in the databases 2929, 2930, and 2931.

Figure 28A:
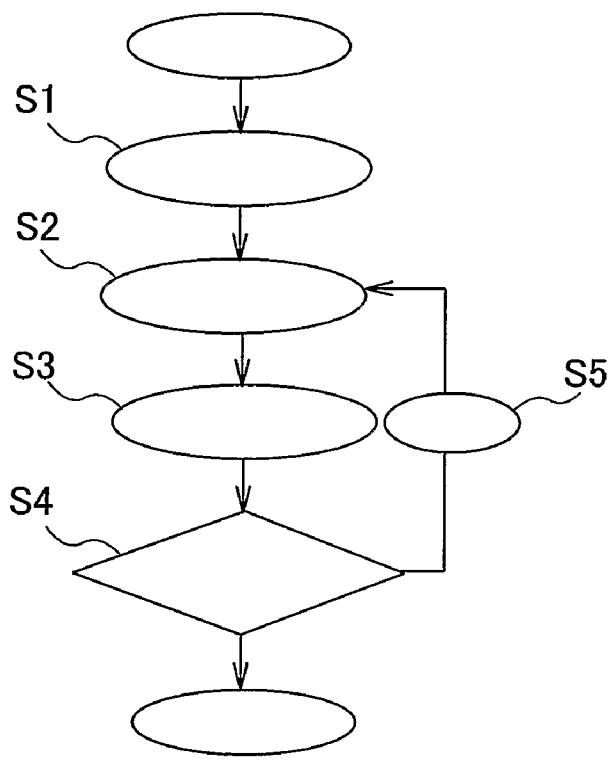
FIGS. 28A and 28B are flowcharts of the examples to which the semiconductor devices according to the present invention are applied.
Figure 28B:
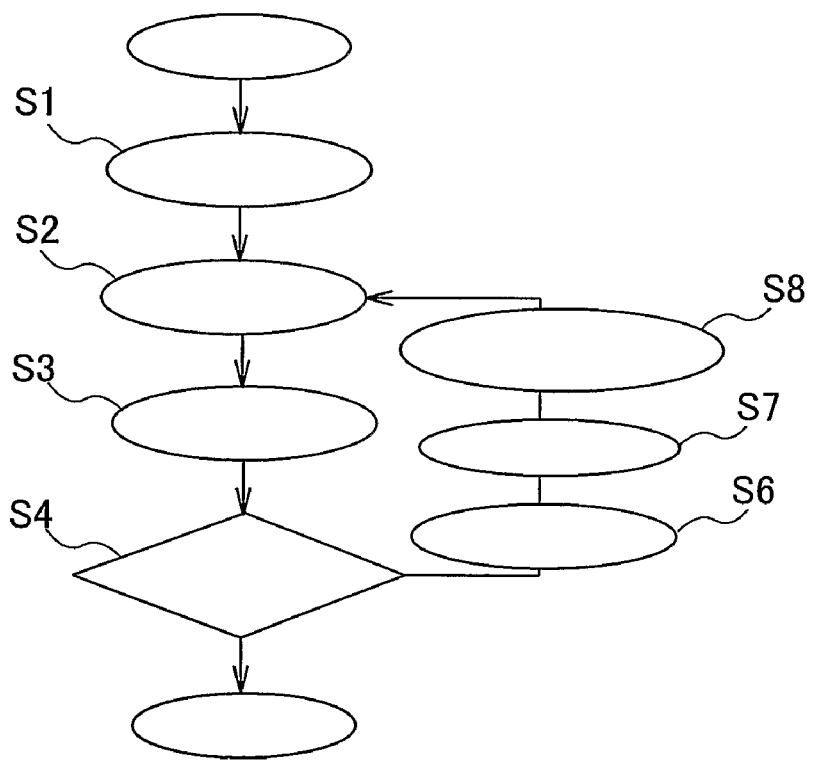

The present embodiment will be described with reference to flowcharts. As shown in FIG. 28A, the present embodiment starts with the placement of the wireless chip 3000 in the road. Initial information on the road is input into the wireless chip (S1). At this point, the initial information such as the date of built and the building components is stored in the memory of the wireless chip 3000.

Then, the wireless chip 3000 in the road can be periodically powered by periodically transmitting radio waves with the instruction 1 from the base station. In accordance with the instruction 1, temperature information detected by the sensor at that moment is stored in the memory. In this way, the wireless chip 3000 in the road is allowed to store temperature information (S2). At this point, the information on temperature, which is obtained from the sensor, is written in the memory of the wireless chip 3000. By providing sensors for detecting pressure, humidity, and the like in addition to temperature, information on these may be added.

On a periodic basis, a means for carrying out transmission and reception with the wireless chip 3000 (for example, a car equipped with a reader/writer 110) is used to transmit the instruction 2 to the wireless chip 3000 to gather the temperature information. In this way, the stored information can be obtained (S3). Thus, the temperature information on the road with time, which is obtained from the memory, is allowed to be obtained and gathered. At this point, the instruction 3 may be transmitted to erase information in the wireless chip 3000, if necessary.

Based on the gathered initial information and information with time, the condition of the road can be assessed, and the timing of repair can be decided (S4).

Then, the information with time and the like can be gathered in an information processing device owned by the manager of the building or the like and processed by the information processing device. For example, the timing of repair can be determined in the order corresponding to the degree of deterioration. Further, in the server owned by the manager, estimates for the time and cost of the repair can be calculated, and a selection can be made from candidates for the builder. Then, the timing of repair can be determined in consideration of the cost, time, and builder. When the necessity of repair is decided in this way, the whole road or a portion thereof is repaired (S5).

After repairing the whole road or a portion thereof, information with time is again stored in the wireless chip 3000 with repair information. (S2), and the process is repeated. At this point, a new wireless chip may be placed in the repaired section.

Then, the process is terminated with destruction or disappearance of the building.

Figure 30B:
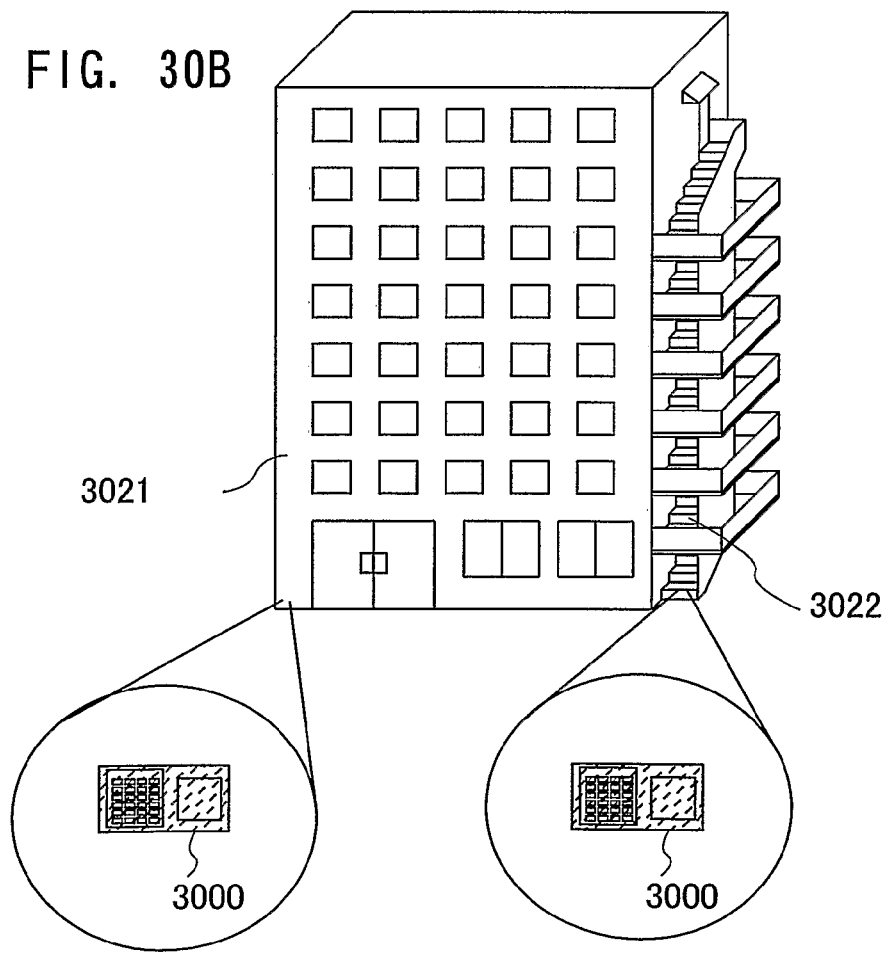

Also, temperature information on the building with time can be gathered by arranging wireless chips with sensors for not only the road but also the wall, ceiling, and floor of the building. For example, wireless chips can be placed for outward walls 3021 and stairs 3022 of a building as shown in FIG. 30B. The placement of a wireless chip includes implanting the wireless chip into a wall or a pillar as in the case of the road. However, in the case of applying the wireless chip 3000 with the temperature sensor or a wireless chip with a humidity sensor, the wireless chip may be attached on the surface of the building or implanted into a member constituting the building while the implant mode is preferable in the case of applying a wireless chip with a pressure sensor. Then, it is possible to decide if the building is decrepit. The wireless chip with the sensor provided in the building is allowed to be present in a transmittable and receivable range by providing one or more readers/writers in each building. Accordingly, the reader/writer allows power supply and transmissions of instructions to the wireless chip 3000, and is allowed to receive information from the wireless chip 3000.

In addition, in the case of repair, an opportunity for asking demands from users may be provided. For example, when the necessity of repair is decided, notifications of the repair are transmitted from the manager to people (users) using the building (S6). In the notifications, the content asking demands of the users on the repair is described. After obtaining demand information from the users (S7), repair reflecting this information can be carried out (S8).

It is preferable that the builder that constructs a building adequately carry out a reliability test against temperature, humidity, or pressure stress to estimate temperature, humidity, or pressure stress conditions under which the building needs to be repaired. In the information processing device, gathered information is compared with these estimated conditions to decide whether to need repair or not.

This building management system allows information on stress with time to be obtained continuously, and it is thus unnecessary to go off to the field of the building. Then, management regarding repair of the building can be carried out collectively. It is to be noted that the present invention is effective especially in the case of reading a plurality of wireless chips, and can be applied advantageously in this application example.

This application is based on Japanese Patent Application serial no. 2005-157843 filed in Japan Patent Office on May 30 in 2005, the entire contents of which are hereby incorporated by reference.

The invention claimed is:

1. A semiconductor device comprising a resonance circuit, said resonance circuit comprising:
   an N-type MOS capacitor element that has a threshold voltage in the range of −0.1 V to −24 V; and
   an antenna electrically connected to the N-type MOS capacitor element,
   wherein an absolute value of the threshold voltage of the N-type MOS capacitor element is in the range of half of a minimum operation power supply voltage to twice a maximum operation power supply voltage, and
   wherein data is wirelessly transmitted and received through the antenna.

2. The semiconductor device according to claim 1, wherein a semiconductor region of the N-type MOS capacitor element includes an N-type impurity element at a concentration of $1 \times 10^{17}$ atoms/cm$^3$ to $1 \times 10^{20}$ atoms/cm$^3$.

3. A semiconductor device comprising a resonance circuit, said resonance circuit comprising:
   a P-type MOS capacitor element that has a threshold voltage in the range of 0.1 V to 24 V; and
   an antenna electrically connected to the P-type MOS capacitor element,
   wherein an absolute value of the threshold voltage of the P-type MOS capacitor element is in the range of half of a minimum operation power supply voltage to twice a maximum operation power supply voltage, and
   wherein data is wirelessly transmitted and received through the antenna.

4. The semiconductor device according to claim 3, wherein a semiconductor region of the P-type MOS capacitor element includes a P-type impurity element at a concentration of $1 \times 10^{17}$ atoms/cm$^3$ to $1 \times 10^{20}$ atoms/cm$^3$.

5. The semiconductor device according to any one of claims 1 and 3, further comprising an integrated circuit provided over a glass substrate or a flexible substrate.

6. The semiconductor device according to any one of claims 1 and 3, further comprising an integrated circuit including a thin film transistor.

7. A bill, a coin, securities, a certificate, a bearer bond, a container for wrapping, a book, a storage medium, a vehicle, food, a garment, a health product, a daily commodity, medicine, or an electronic device equipped with the semiconductor device according to any one of claims 1 and 3.

* * * * *